US012761281B2

(12) United States Patent
Takacs et al.

(10) Patent No.: US 12,761,281 B2
(45) Date of Patent: Oct. 13, 2026

(54) MANAGED FAST CHARGING FOR ELECTRIC VEHICLES

(71) Applicant: Garrett Transportation I Inc., Torrance, CA (US)

(72) Inventors: Gergely Takacs, Dunajská Streda (SK); Jaroslav Pekar, Pacov (CZ); Tomas Poloni, Malinovo (SK)

(73) Assignee: Garrett Transportation I Inc., Torrance, CA (US)

( * ) Notice: Subject to any disclaimer, the term of this patent is extended or adjusted under 35 U.S.C. 154(b) by 0 days.

(21) Appl. No.: 18/441,650

(22) Filed: Feb. 14, 2024

(65) Prior Publication Data

US 2025/0044365 A1 Feb. 6, 2025

Related U.S. Application Data

(60) Provisional application No. 63/517,577, filed on Aug. 3, 2023.

(51) Int. Cl.
*B60L 53/62* (2019.01)
*B60L 58/12* (2019.01)
(Continued)

(52) U.S. Cl.
CPC ............ *F16C 17/024* (2013.01); *B60L 53/62* (2019.02); *B60L 58/12* (2019.02); *B60L 58/16* (2019.02);
(Continued)

(58) Field of Classification Search
CPC .......... B60L 53/60; B60L 53/62; B60L 53/66; B60L 58/10; B60L 58/12; B60L 58/16; G01R 31/367; G01R 31/374; G01R 31/382; G01R 31/3835; G01R 31/3842; G01R 31/387; G01R 31/388; G01R 31/389; G01R 31/396; H01M 10/443; H01M 10/48;
(Continued)

(56) References Cited

U.S. PATENT DOCUMENTS 6,075,346 A 6/2000 Kikuchi et al.
6,154,011 A 11/2000 Lam et al.
(Continued)

FOREIGN PATENT DOCUMENTS

DE 10158029 A1 6/2002
DE 102010023730 A1 1/2011
(Continued)

OTHER PUBLICATIONS

Al Faruque, et al., "Modeling, Analysis, and Optimization of Electric Vehicle HVAC Systems," IEEE, pp. 423-428, 6 pages. 2016.
(Continued)

*Primary Examiner* — Levi Gannon
(74) *Attorney, Agent, or Firm* — BelayIP

(57) ABSTRACT

Methods and systems for controlling charging of the battery in an electric vehicle. Lithium plating is monitored, measured, or estimated. Identification of lithium plating conditions is used to determine whether and when to reduce charging current. Conversely, if no lithium plating conditions are identified, charging current may be increased toward a maximum level determined based on the state, age and/or health of the battery.

19 Claims, 20 Drawing Sheets

(51) Int. Cl.
*B60L 58/16* (2019.01)
*F16C 17/02* (2006.01)
*F16C 43/02* (2006.01)
*G01R 31/374* (2019.01)
*G01R 31/387* (2019.01)
*H01M 10/48* (2006.01)

(52) U.S. Cl.
CPC ............ *F16C 43/02* (2013.01); *G01R 31/374* (2019.01); *G01R 31/387* (2019.01); *H01M 10/484* (2013.01); *F05D 2220/40* (2013.01); *F16C 2226/00* (2013.01)

(58) Field of Classification Search
CPC .. H01M 10/484; H01M 10/486; H02J 7/0048; H02J 7/00712; H02J 7/00714; H02J 7/00718; H02J 7/007182; H02J 7/007188; H02J 7/007194
See application file for complete search history.

(56) References Cited

U.S. PATENT DOCUMENTS 6,300,763 B1 10/2001 Kwok
6,388,447 B1 5/2002 Hall et al.
6,674,265 B2 1/2004 Yoshida et al.
7,545,146 B2 6/2009 Klang et al.
7,647,788 B2 1/2010 Okuda et al.
7,847,557 B2 12/2010 Yun et al.
8,082,743 B2 12/2011 Hermann et al.
8,344,697 B2 1/2013 Lienkamp et al.
8,410,760 B2 4/2013 Formanski et al.
8,417,403 B2 4/2013 Iida et al.
8,527,122 B2 9/2013 Yamada et al.
8,554,473 B2 10/2013 Arcot et al.
8,594,918 B2 11/2013 Meyer-Ebeling et al.
8,754,614 B2 6/2014 Paryani et al.
8,838,318 B2 9/2014 Segawa et al.
8,849,598 B2 9/2014 Mingant et al.
8,872,517 B2 10/2014 Philbrook et al.
9,014,959 B2 4/2015 Kanno et al.
9,079,507 B2 7/2015 Smith et al.
9,132,746 B2 9/2015 Enomoto et al.
9,139,095 B2 9/2015 Kim
9,197,078 B2 11/2015 Lee
9,217,779 B2 12/2015 Xu et al.
9,267,993 B2 2/2016 Farmer et al.
9,328,945 B2 5/2016 Arai et al.
9,358,898 B2 6/2016 Endo et al.
9,535,132 B2 1/2017 Inguva et al.
9,586,579 B1 3/2017 Laskowsky et al.
9,643,469 B2 5/2017 Kakehashi et al.
9,893,394 B2 2/2018 Shin et al.
9,897,664 B2 2/2018 You et al.
10,000,138 B2 6/2018 Tanaka
10,071,648 B1 * 9/2018 K ............................ B60L 58/21
10,099,569 B2 10/2018 Lindemann et al.
10,107,864 B2 10/2018 Vidhi et al.
10,160,340 B2 12/2018 Lindemann et al.
10,180,460 B1 1/2019 Castelaz
10,209,314 B2 2/2019 Garcia et al.
10,386,422 B2 8/2019 Christensen et al.
10,388,998 B2 8/2019 Choi et al.
10,415,986 B2 9/2019 Meyer et al.
10,471,847 B1 11/2019 Han et al.
10,481,623 B1 11/2019 Forouzan et al.
10,527,678 B2 1/2020 Lee
10,539,621 B2 1/2020 Chow et al.
10,566,817 B2 2/2020 Tkachenko et al.
10,585,146 B2 3/2020 Christensen et al.
10,598,735 B2 3/2020 Lee
10,672,199 B2 6/2020 Landolsi et al.
10,730,401 B2 8/2020 Jin et al.
10,759,303 B2 9/2020 Duan et al.
10,892,631 B2 1/2021 Barsukov et al.
10,931,128 B2 2/2021 Basu et al.
10,962,599 B2 3/2021 Petrucelli
10,989,761 B2 4/2021 Montaru
11,075,414 B2 7/2021 Yokotsuji et al.
11,084,398 B2 8/2021 Marcicki et al.
11,085,969 B2 8/2021 Drees
11,204,391 B2 12/2021 Wampler et al.
11,280,840 B2 3/2022 Chevrier et al.
11,283,103 B2 3/2022 Hong et al.
11,300,620 B2 4/2022 Chen et al.
11,300,626 B2 4/2022 Wampler et al.
11,355,740 B2 6/2022 Holme et al.
11,397,210 B1 7/2022 Peter et al.
11,417,916 B2 8/2022 Duan et al.
11,428,747 B2 8/2022 Ukumori
11,435,405 B2 9/2022 Gong et al.
11,465,529 B1 10/2022 Palombini
11,545,839 B2 1/2023 Sampson et al.
11,567,140 B2 1/2023 Zappen et al.
11,605,849 B2 3/2023 Chuang
11,664,486 B2 5/2023 Xue et al.
11,695,184 B2 7/2023 Roddy et al.
11,703,548 B2 7/2023 Yezerets et al.
11,735,779 B2 8/2023 Junger et al.
2006/0091857 A1 5/2006 Nakanishi et al.
2008/0221787 A1 9/2008 Vavrus
2009/0040033 A1 2/2009 Uchida
2009/0167253 A1 7/2009 Muraoka et al.
2009/0326749 A1 12/2009 Uchida
2010/0021798 A1 1/2010 Kelly et al.
2010/0049397 A1 2/2010 Liu et al.
2010/0324846 A1 12/2010 Marsh et al.
2011/0032110 A1 2/2011 Taguchi
2011/0077880 A1 3/2011 Gering
2011/0082621 A1 4/2011 Berkobin et al.
2011/0100735 A1 5/2011 Flett
2011/0112781 A1 5/2011 Anderson et al.
2011/0156652 A1 6/2011 Kishiyama et al.
2011/0166810 A1 7/2011 Grider et al.
2011/0184600 A1 7/2011 Kristinsson et al.
2011/0238457 A1 9/2011 Mason et al.
2012/0004838 A1 1/2012 Lee et al.
2012/0029744 A1 2/2012 Yun et al.
2012/0101674 A1 4/2012 Wang et al.
2012/0116620 A1 5/2012 Wang et al.
2012/0116699 A1 5/2012 Haag et al.
2012/0136574 A1 5/2012 Kobayashi et al.
2012/0143413 A1 6/2012 Cho et al.
2012/0143435 A1 6/2012 Cho et al.
2012/0176231 A1 7/2012 Skaff et al.
2012/0179359 A1 7/2012 Profitt-Brown et al.
2012/0179395 A1 7/2012 Gilman et al.
2012/0232783 A1 9/2012 Calkins et al.
2013/0046428 A1 2/2013 Jordan
2013/0066498 A1 3/2013 Nissato
2013/0069660 A1 3/2013 Bernard et al.
2013/0073113 A1 3/2013 Wang et al.
2013/0079962 A1 3/2013 Ishikawa et al.
2013/0096858 A1 4/2013 Amano et al.
2013/0113424 A1 5/2013 Froelich
2013/0116868 A1 5/2013 Erko et al.
2013/0147432 A1 6/2013 Yamamoto et al.
2013/0151046 A1 6/2013 Choi et al.
2013/0151056 A1 6/2013 Nakano
2013/0169232 A1 7/2013 Middleton et al.
2013/0238189 A1 9/2013 Michaelis
2013/0268152 A1 10/2013 Koshizen et al.
2013/0311016 A1 11/2013 Kim
2013/0317690 A1 11/2013 Fujita et al.
2013/0325335 A1 12/2013 Kee et al.
2013/0332013 A1 12/2013 Malone et al.
2014/0005855 A1 1/2014 Hu et al.
2014/0014421 A1 1/2014 Carpenter et al.
2014/0023905 A1 1/2014 Taniyama et al.
2014/0025255 A1 1/2014 Xiaoli
2014/0028681 A1 1/2014 Hirayama
2014/0046595 A1 2/2014 Segawa et al.
2014/0074329 A1 3/2014 Yang et al.
2014/0143002 A1 5/2014 Aisu

(56) References Cited

U.S. PATENT DOCUMENTS

| | | | | |
|---|---|---|---|---|
| 2014/0163854 | A1 | 6/2014 | Matsumoto et al. | |
| 2014/0172282 | A1 | 6/2014 | Feng et al. | |
| 2014/0188304 | A1 | 7/2014 | Richter et al. | |
| 2014/0210415 | A1 | 7/2014 | Ohmori | |
| 2014/0266059 | A1 | 9/2014 | Li et al. | |
| 2014/0306519 | A1 | 10/2014 | Song | |
| 2014/0326430 | A1 | 11/2014 | Carpenter et al. | |
| 2014/0336965 | A1 | 11/2014 | Mori et al. | |
| 2014/0338376 | A1 | 11/2014 | Carpenter et al. | |
| 2015/0002105 | A1 | 1/2015 | Kelly | |
| 2015/0079433 | A1 | 3/2015 | Tamai et al. | |
| 2015/0147608 | A1 | 5/2015 | Lin et al. | |
| 2015/0165919 | A1 | 6/2015 | Hughes | |
| 2015/0180090 | A1 | 6/2015 | Duan | |
| 2015/0183293 | A1 | 7/2015 | Kim | |
| 2015/0258907 | A1 | 9/2015 | Lee | |
| 2015/0266390 | A1 | 9/2015 | Shin et al. | |
| 2015/0329003 | A1 | 11/2015 | Li et al. | |
| 2015/0349385 | A1 | 12/2015 | Hu et al. | |
| 2016/0016564 | A1 | 1/2016 | Otake et al. | |
| 2016/0061610 | A1 | 3/2016 | Meyer et al. | |
| 2016/0137090 | A1 | 5/2016 | Nam et al. | |
| 2016/0146895 | A1 | 5/2016 | Yazami | |
| 2016/0172886 | A1 | 6/2016 | Keates | |
| 2016/0176309 | A1 | 6/2016 | Jeon et al. | |
| 2016/0209472 | A1 | 7/2016 | Chow et al. | |
| 2016/0229411 | A1 | 8/2016 | Murata | |
| 2016/0238666 | A1 | 8/2016 | Kelly | |
| 2016/0239592 | A1 | 8/2016 | Pourmousavi Kani | |
| 2016/0243941 | A1 | 8/2016 | Kishida | |
| 2016/0285284 | A1 | 9/2016 | Matlapudi et al. | |
| 2016/0301114 | A1 | 10/2016 | Izumi et al. | |
| 2016/0311330 | A1 | 10/2016 | Liu | |
| 2016/0318499 | A1 | 11/2016 | Yamanaka et al. | |
| 2016/0332505 | A1 | 11/2016 | Yamanaka et al. | |
| 2016/0351981 | A1 | 12/2016 | Porras et al. | |
| 2016/0363632 | A1 | 12/2016 | Park et al. | |
| 2016/0375782 | A1 | 12/2016 | Liu | |
| 2017/0003352 | A1 | 1/2017 | Barre et al. | |
| 2017/0028912 | A1 | 2/2017 | Yang et al. | |
| 2017/0067966 | A1 | 3/2017 | Min | |
| 2017/0088000 | A1 | 3/2017 | Payne et al. | |
| 2017/0088008 | A1 | 3/2017 | Melendez et al. | |
| 2017/0092992 | A1 | 3/2017 | Duan | |
| 2017/0120774 | A1 | 5/2017 | Obata | |
| 2017/0120775 | A1 | 5/2017 | Murata et al. | |
| 2017/0129361 | A1 | 5/2017 | Scaringe | |
| 2017/0133731 | A1 | 5/2017 | Hermann | |
| 2017/0259687 | A1 | 9/2017 | Chikkannanavar et al. | |
| 2017/0282739 | A1 | 10/2017 | Cha et al. | |
| 2017/0305292 | A1 | 10/2017 | Minamiura et al. | |
| 2017/0352203 | A1 | 12/2017 | Jansson | |
| 2017/0352930 | A1 | 12/2017 | Masias et al. | |
| 2018/0053965 | A1 | 2/2018 | Marcicki et al. | |
| 2018/0118033 | A1 | 5/2018 | Lu et al. | |
| 2018/0128881 | A1 | 5/2018 | Kelly | |
| 2018/0226695 | A1 | 8/2018 | Miyaki et al. | |
| 2018/0236898 | A1 | 8/2018 | Ji | |
| 2018/0241234 | A1 | 8/2018 | Liang et al. | |
| 2018/0248396 | A1 | 8/2018 | Keates | |
| 2018/0287227 | A1 | 10/2018 | Jeong et al. | |
| 2018/0304765 | A1 | 10/2018 | Newman et al. | |
| 2018/0316195 | A1* | 11/2018 | Verbrugge | H01M 10/44 |
| 2018/0340983 | A1 | 11/2018 | Li et al. | |
| 2019/0031035 | A1* | 1/2019 | Koch | H01M 10/0525 |
| 2019/0043270 | A1 | 2/2019 | Hemes et al. | |
| 2019/0084399 | A1 | 3/2019 | Ohara et al. | |
| 2019/0140327 | A1 | 5/2019 | Fukada et al. | |
| 2019/0176639 | A1 | 6/2019 | Kumar et al. | |
| 2019/0187212 | A1 | 6/2019 | Garcia et al. | |
| 2019/0197580 | A1 | 6/2019 | Harty | |
| 2019/0285704 | A1 | 9/2019 | Lee | |
| 2019/0393564 | A1* | 12/2019 | Miura | H01M 4/133 |
| 2020/0011932 | A1 | 1/2020 | Hooshmand et al. | |
| 2020/0079390 | A1 | 3/2020 | Jun et al. | |
| 2020/0136173 | A1* | 4/2020 | Hong | H01M 10/0525 |
| 2020/0160619 | A1 | 5/2020 | Wang et al. | |
| 2020/0198495 | A1 | 6/2020 | Rizzoni et al. | |
| 2020/0203780 | A1 | 6/2020 | Mandli et al. | |
| 2020/0210541 | A1* | 7/2020 | Han | H01M 10/4207 |
| 2020/0212515 | A1 | 7/2020 | King et al. | |
| 2020/0251788 | A1 | 8/2020 | Sood et al. | |
| 2020/0300920 | A1 | 9/2020 | Christophersen et al. | |
| 2020/0412153 | A1* | 12/2020 | Matsumura | H02J 7/0031 |
| 2021/0016664 | A1 | 1/2021 | Deng et al. | |
| 2021/0031654 | A1 | 2/2021 | Vizzini et al. | |
| 2021/0053450 | A1 | 2/2021 | Oh et al. | |
| 2021/0101504 | A1 | 4/2021 | Okamoto et al. | |
| 2021/0131812 | A1 | 5/2021 | Gong et al. | |
| 2021/0138927 | A1 | 5/2021 | Maeng et al. | |
| 2021/0143391 | A1 | 5/2021 | Wood, III et al. | |
| 2021/0175547 | A1 | 6/2021 | Dahn et al. | |
| 2021/0180967 | A1 | 6/2021 | Chae et al. | |
| 2021/0215628 | A1 | 7/2021 | Christophersen | |
| 2021/0242518 | A1 | 8/2021 | Shrivastava et al. | |
| 2021/0273270 | A1 | 9/2021 | Fujikawa et al. | |
| 2021/0284179 | A1 | 9/2021 | Diamond et al. | |
| 2021/0300197 | A1 | 9/2021 | Yi | |
| 2021/0309196 | A1 | 10/2021 | Son et al. | |
| 2021/0328449 | A1 | 10/2021 | Li et al. | |
| 2021/0344212 | A1* | 11/2021 | Jee | G01R 31/367 |
| 2021/0354591 | A1 | 11/2021 | Iida et al. | |
| 2021/0359317 | A1 | 11/2021 | Kaushik et al. | |
| 2021/0379999 | A1 | 12/2021 | Yang et al. | |
| 2021/0382115 | A1 | 12/2021 | Woll et al. | |
| 2021/0382473 | A1 | 12/2021 | Stano et al. | |
| 2021/0384753 | A1 | 12/2021 | Kozuma et al. | |
| 2022/0009367 | A1 | 1/2022 | Lee et al. | |
| 2022/0057451 | A1 | 2/2022 | Viswanathan et al. | |
| 2022/0069361 | A1* | 3/2022 | Surampudi | H02J 7/00712 |
| 2022/0091062 | A1 | 3/2022 | Gullapalli et al. | |
| 2022/0097557 | A1 | 3/2022 | Lee et al. | |
| 2022/0105829 | A1 | 4/2022 | Nakagawa | |
| 2022/0114519 | A1 | 4/2022 | Hencken et al. | |
| 2022/0131400 | A1 | 4/2022 | Nakao et al. | |
| 2022/0137149 | A1 | 5/2022 | Crane et al. | |
| 2022/0149645 | A1 | 5/2022 | Ramanujam et al. | |
| 2022/0158167 | A1 | 5/2022 | Xiao et al. | |
| 2022/0166017 | A1 | 5/2022 | Su et al. | |
| 2022/0221516 | A1 | 7/2022 | Lee et al. | |
| 2022/0244317 | A1 | 8/2022 | Oji | |
| 2022/0263144 | A1 | 8/2022 | Xie et al. | |
| 2022/0268851 | A1 | 8/2022 | Epureanu et al. | |
| 2022/0336809 | A1 | 10/2022 | Choi | |
| 2022/0343702 | A1 | 10/2022 | Pekar et al. | |
| 2022/0381835 | A1 | 12/2022 | Yang et al. | |
| 2022/0407324 | A1 | 12/2022 | Jung et al. | |
| 2023/0009045 | A1 | 1/2023 | Kang | |
| 2023/0009288 | A1 | 1/2023 | Kang | |
| 2023/0015952 | A1 | 1/2023 | Kosyakov | |
| 2023/0052544 | A1* | 2/2023 | Yuan | G01R 31/392 |
| 2023/0064240 | A1 | 3/2023 | Zhou et al. | |
| 2023/0093445 | A1 | 3/2023 | Kim et al. | |
| 2023/0105040 | A1 | 4/2023 | Wienhausen et al. | |
| 2023/0152385 | A1 | 5/2023 | Richter et al. | |
| 2023/0173946 | A1 | 6/2023 | Foland | |
| 2023/0231403 | A1* | 7/2023 | Feng | H02J 7/005<br>320/162 |
| 2024/0132047 | A1 | 4/2024 | Herceg et al. | |
| 2024/0132048 | A1 | 4/2024 | Dolisnsky et al. | |
| 2024/0132066 | A1 | 4/2024 | Vosahlik et al. | |
| 2024/0262242 | A1 | 8/2024 | Poloni | |
| 2024/0426934 | A1* | 12/2024 | Kim | G01R 31/367 |

FOREIGN PATENT DOCUMENTS

| | | | |
|---|---|---|---|
| DE | 102011116516 | A1 | 4/2012 |
| DE | 102014201349 | A1 | 7/2015 |
| DE | 102014201357 | A1 | 7/2015 |
| DE | 102017103730 | A1 | 9/2017 |
| EP | 2631663 | A1 | 8/2013 |
| EP | 2660615 | A1 | 11/2013 |
| EP | 2661382 | A1 | 11/2013 |
| EP | 2963433 | A1 | 1/2016 |

(56) References Cited

FOREIGN PATENT DOCUMENTS

| | | | |
|---|---|---|---|
| EP | 3234506 | A1 | 10/2017 |
| EP | 3279679 | A1 | 2/2018 |
| EP | 1922781 | B1 | 4/2018 |
| EP | 3499634 | A1 | 6/2019 |
| EP | 3706280 | A1 | 9/2020 |
| EP | 3806270 | A1 | 4/2021 |
| EP | 3878706 | A1 | 9/2021 |
| EP | 4010220 | A1 | 6/2022 |
| EP | 4094084 | A1 | 11/2022 |
| EP | 4138170 | A1 | 2/2023 |
| EP | 4174504 | A1 | 5/2023 |
| EP | 4199178 | A1 | 6/2023 |
| WO | 2005039919 | A1 | 5/2005 |
| WO | 2009020217 | A1 | 2/2009 |
| WO | 2010055271 | A1 | 5/2010 |
| WO | 2011001609 | A1 | 1/2011 |
| WO | 2011072564 | A1 | 6/2011 |
| WO | 2012087018 | A2 | 6/2012 |
| WO | 2012091076 | A1 | 7/2012 |
| WO | 2012140835 | A1 | 10/2012 |
| WO | 2013157214 | A1 | 10/2013 |
| WO | 2014185163 | A1 | 11/2014 |
| WO | 2015045505 | A1 | 4/2015 |
| WO | 2015110602 | A1 | 7/2015 |
| WO | 2015110603 | A1 | 7/2015 |
| WO | 2015174279 | A1 | 11/2015 |
| WO | 2016086182 | A2 | 6/2016 |
| WO | 2017071657 | A1 | 5/2017 |
| WO | 2018079164 | A1 | 5/2018 |
| WO | 2018104314 | A1 | 6/2018 |
| WO | 2018112818 | A1 | 6/2018 |
| WO | 2018192190 | A1 | 10/2018 |
| WO | 2019018974 | A1 | 1/2019 |
| WO | 2019113828 | A1 | 6/2019 |
| WO | 2019138731 | A1 | 7/2019 |
| WO | 2019163398 | A1 | 8/2019 |
| WO | 2019181311 | A1 | 9/2019 |
| WO | 2019218769 | A1 | 11/2019 |
| WO | 2019243157 | A1 | 12/2019 |
| WO | 2020041767 | A1 | 2/2020 |
| WO | 2020051738 | A1 | 3/2020 |
| WO | 2020080690 | A1 | 4/2020 |
| WO | 2020131948 | A1 | 6/2020 |
| WO | 2020135481 | A1 | 7/2020 |
| WO | 2020153190 | A1 | 7/2020 |
| WO | 2020191800 | A1 | 10/2020 |
| WO | 2020241001 | A1 | 12/2020 |
| WO | 2020259225 | A1 | 12/2020 |
| WO | 2021014406 | A1 | 1/2021 |
| WO | 2021044132 | A1 | 3/2021 |
| WO | 2021044134 | A1 | 3/2021 |
| WO | 2021118170 | A1 | 6/2021 |
| WO | 2021134746 | A1 | 7/2021 |
| WO | 2021181536 | A1 | 9/2021 |
| WO | 2021185308 | A1 | 9/2021 |
| WO | 2021217662 | A1 | 11/2021 |
| WO | 2021229070 | A1 | 11/2021 |
| WO | 2021229072 | A1 | 11/2021 |
| WO | 2022001977 | A1 | 1/2022 |
| WO | 2022024848 | A1 | 2/2022 |
| WO | 2022024885 | A1 | 2/2022 |
| WO | 2022026336 | A1 | 2/2022 |
| WO | 2022056486 | A1 | 3/2022 |
| WO | 2022065813 | A1 | 3/2022 |
| WO | 2022096898 | A2 | 5/2022 |
| WO | 2022111563 | A1 | 6/2022 |
| WO | 2022119524 | A1 | 6/2022 |
| WO | 2022126254 | A1 | 6/2022 |
| WO | 2022138745 | A1 | 6/2022 |
| WO | 2022143129 | A1 | 7/2022 |
| WO | 2022169652 | A1 | 8/2022 |
| WO | 2022170671 | A1 | 8/2022 |
| WO | 2022174698 | A1 | 8/2022 |
| WO | 2022175146 | A1 | 8/2022 |
| WO | 2022231062 | A1 | 11/2022 |
| WO | 2022244008 | A1 | 11/2022 |
| WO | 2022247991 | A1 | 12/2022 |
| WO | 2022251026 | A2 | 12/2022 |
| WO | 2022268362 | A1 | 12/2022 |
| WO | 2022269538 | A1 | 12/2022 |
| WO | 2023284453 | A1 | 1/2023 |
| WO | 2023035074 | A1 | 3/2023 |
| WO | 2023059652 | A1 | 4/2023 |
| WO | 2023066469 | A1 | 4/2023 |
| WO | 2023072110 | A1 | 5/2023 |
| WO | 2023078590 | A1 | 5/2023 |
| WO | 2023080633 | A1 | 5/2023 |
| WO | 2023124913 | A1 | 7/2023 |

OTHER PUBLICATIONS

Amini et al., "Hierarchical MPC for Robust Eco-Cooling of Connected and Automated Vehicles and Its Application to Electric Vehicle Battery Thermal Management," IEEE, 13 pages. 2020.

Dedek et al., BEV Remaining Range Estimation Based on Modern Control Theory-Initial Study, IFAC-Papers Online, vol. 52, Issue 27, pp. 86-91. 2019.

Hamut et al., "Exergy analysis of a TMS (thermal management system) for range-extended EVs (electric vehicles)," Elsevier Journal, pp. 117-125, 9 pages. Feb. 4, 2012.

Heiskanen, et al., "Generation and Evolution of the Solid Electrolyte Interphase of Lithium-Ion Batteries," Joule 3, pp. 2322-2333, 11 pages. Oct. 16, 2019.

Jog et al., "Dynamic Energy Modeling of Battery Climate System in an Electric Vehicle," Chalmers University of Technology, 78 pages. 2017.

Lahlou, "Energy and Thermal Comfort Management Strategies for Battery Electric Vehicles," Sorbonne University/HAL Open Science, 153 pages. Jun. 2, 2021.

Malmir et al., "A Heuristic Supervisory Controller for a 48V Hybrid Electric Vehicle Considering Fuel Economy and Battery Aging." SAE International by Clemson University Libraries, 10 pages, Jan. 20, 2019.

Murashko Kirill et al., "Modelling of the Battery Pack Thermal Management System for Hybrid Electric Vehicles," Lappeenranta University of Technology/IEEE, 10 pages. Aug. 2014.

Nguyen et al., "Model Selection for Degradation Modeling and Prognosis with Health Monitoring Data," Reliability Engineering and System Safety, vol. 169, pp. 105-116. 2018.

Partial European Search Report for International Application No. 222034290, dated Jul. 18, 2023. (14 Pages).

International Search Report and Written Opinion for International Application No. PCT/US2024/0141149, dated May 21, 2024. (18 Pages).

Randall et al., "Controls Oriented Reduced Order Modeling of Lithium Deposition on Overcharge," Journal of Power Resources. vol. 209, pp. 318-325. Available Online Mar. 7, 2012.

Prasek et al., "Range control MPC with application to Vapor Compression Cycles," Elsevier Journal, 14 pages. Jan. 2020.

Sarvaiya et al., "Comparative Analysis of Hybrid Vehicle Energy Mangagement Strategies with Optimisation of Fuel Economy and Battery Life," Energy, vol. 228, 27 Pages. Aug. 1, 2021.

Suri et al., "A Control-Oriented Cycle-Life Model for Hybrid Electric Vehicle Lithium-Ion Batteries," Energy, vol. 96, pp. 644-653. Available Online Feb. 4, 2016.

Wang et al., "A review on research status and key technologies of battery thermal management and its enhanced safety," Wiley International Journal of Energy Research, 26 pages. Jun. 2018.

Yan et al., "Battery thermal management strategy for electric vehicles based on nonlinear model predictive control," Elsevier Journal, pp. 1-11, 11 pages. Sep. 4, 2021.

U.S. Appl. No. 18/498,996, filed Oct. 31, 2023.

Azizghalehsari et al., "A Review of Lithium-Ion Batteries Diagnostics and Prognostic Challenges," 47th Annual Conference of the IEEE Industrial Electronics Society, 6 pages. 2021. Accessed Jan. 17, 2022.

(56) References Cited

OTHER PUBLICATIONS

Adany et al., "Switching Algorithms for Extending Battery Life in Electric Vehicles," Journal of Power Sources, vol. 231, pp. 50-59. 2013. Available Online Dec. 27, 2012.
WO-2019218769-A1 Machine Translation (Year: 2019).
Bibinsha et al., "Machine Learning Based Battery Aging Management Strategy for Electric Vehicles," 2021 Second International Conference on Electronics and Sustainable Communication Systems, IEEE Xplore, 7 pages. Aug. 2021.
Chen et al., "A New State-of-Health Estimation Method for Lithium-Ion Batteries through the Intrinsic Relationship between Ohmic Internal Resistance and Capacity," Measurement, pp. 586-595, Feb. 2018.
Dong et al., "Lithium-Ion Battery State of Health Monitoring and Remaining Useful Life Prediction Based on Support Vector Regression-Particle Filter," Journal of Power Sources, vol. 271, pp. 114-123. Available Online Aug. 6, 2014.
Barai et al., "A Study of the Influence of Measurement Timescale on Internal Resistance Characterisation Methodologies for Lithium-Ion Cells," Scientific Reports, vol. 8, No. 21, 13 Pages. Published Online Jan. 8, 2018.
Nacu et al., "Lithium-Ion Cell Characterization, using Hybrid Current Pulses, for Subsequent Battery Simulation in Mobility Applications," Processes, vol. 10, 10 Pages, Published Oct. 18, 2022.
Smith et al., "Lithium-Ion Battery Life Model with Electrode Cracking and Early-Life Break-in Process," Journal of the Electrochemical Society, vol. 168, 17 Pages. Published Oct. 22, 2021.

* cited by examiner

*Prior Art*

MANAGED FAST CHARGING FOR ELECTRIC VEHICLES

CROSS REFERENCE TO RELATED APPLICATIONS

The present application claims the benefit of and priority to U.S. Provisional Patent Application No. 63/517,577, titled CONTROL SYSTEMS, METHODS AND DEVICES, filed on Aug. 3, 2023, the disclosure of which is incorporated herein by reference.

BACKGROUND

Consumer demand to reduce the charge times of battery electric vehicles (BEV) has led to the development of direct-current (DC) charging regimes. DC charging uses high current levels to reduce charging to a desired battery state of charge (SOC). Various names apply, including fast charging, quick charging, rapid charging, DC charging, Level 3 charging and others.

In discussions of fast charging, reference is made to C-rate or C, which is the charging current expressed in units relative to cell nominal capacity. That is, at current equal to one C (1 C), the battery would reach full nominal capacity in one hour. With target charge times in the range of about 15 minutes, rates exceeding 1 C are used, however, recharging at such currents can introduce safety, longevity, and other issues.

Most BEVs use lithium-ion batteries. In lithium-ion batteries, high current charging combined at elevated temperatures may trigger a subset of degradation mechanisms. Examples of such include secondary electrolyte-interphase layer (SEI) formation, electrolyte drying and dissolution of the positive electrode. SEI growth phenomena causes a deposit of inert layer on electrodes by an irreversible decomposition of electrolyte components. On the other hand, high current charging at low temperatures may result in capacity fade due to the loss of lithium inventory by, for example, lithium plating, and power fade caused by reduction in the porosity of the negative electrode. Lithium plating may be understood as the phenomena of metallic lithium depositing on the anode surface instead of intercalating into the electrode lattice.

In relation to temperature, the dominating degradation mechanisms at fast charging are paradoxical to each other. Lithium plating is to be expected at low temperatures, and SEI growth is to be expected at high temperatures. SEI growth is generally considered less damaging for the relatively short duration of the charge event. Nevertheless, the these two (and other) degradation vectors are interconnected by a complex web of interactions. A further constraint arises due to safety, because if the internal temperature of the cell increases over 90° C., the volatile organic solvents present in the electrolyte can boil off the solvent, increasing the internal pressure of the cell and forcing the solvent to vent presenting both fire and explosion hazards.

Many fast charging algorithms use rigid formulae for determining charging current. For example, prior art FIG. 1 uses a constant current $I_{cc}$ to charge the battery during a period $t_1$, at the end of which the battery reaches a maximum voltage. After $t_1$, the charger applies constant voltage at the battery nominal maximum voltage, $V_{cc}$, until the battery reaches a desired final state of charge, $SOC_f$, at time $t_2$. The right axis illustrates a comparison of anode overpotential against the Li/Li+ reference electrode, which can be seen to dip below zero after time $t_1$ as highlighted by the oval and reference. This indicates that degradation of the battery due to lithium plating is occurring until the anode overpotential increases.

Standard fast charging according to the method illustrated in FIG. 1 has been shown to significantly reduce battery lifetime, in part due to the anode overpotential phenomenon just highlighted. In response, different charging profiles have been introduced. FIG. 2 shows a multi-constant current constant voltage (MCCV) profile. Here, the charger issues a first constant current, $I_{cc1}$, from the start of charge until $t_1$, then at $I_{cc2}$ from $t_1$ to $t_2$, then at $I_{cc3}$ from $t_2$ until $t_3$, after which a constant voltage $V_{cc}$ is applied. In the illustrative profile, $I_{cc1}>I_{cc2}>I_{cc3}$.

Exact functions used by various OEMs to generate charging profiles are generally not known, but indirect evidence suggests these vary substantially from one to another. U.S. Pat. No. 8,754,614 suggests a macroscopic equivalent impedance-based approach to model degradation as an all-encompassing term, using a simplified equivalent circuit to represent battery dynamics, and a look-up table to estimate battery internal equivalent resistance. U.S. Pat. No. 11,283,103 uses a complete electrochemical model to estimate the microscopic-scale battery state, from which it determines charging current to avoid degradation. These types of analysis are similarly found in other literature.

New and alternative methods for quickly charging BEV batteries are desired, in particular strategies that are able to obtain and use battery feedback during charging to achieve a better balance between charging time and battery degradation.

Overview

The present inventors have recognized, among other things, that a problem to be solved is the need for new and/or alternative methods for quickly charging BEV batteries.

A first illustrative and non-limiting example takes the form of a method of charging a vehicle battery comprising: determining an estimated state of the vehicle battery; initiating charging of the vehicle battery at a charging current determined from a predetermined model for charging the vehicle battery, the predetermined model including a plurality of modeled secondary electrolyte-interphase layer (SEI) resistance values; measuring SEI resistance as the vehicle battery is charged; adjusting the charging current to enable the measured SEI resistance to track the modeled SEI resistance values.

Additionally or alternatively, the predetermined model is derived by: defining a grid of temperatures; testing a test battery response to injected charge current for a plurality of the grid of temperatures in a series of test current injections corresponding to a plurality of charging current levels; measuring SEI resistance for the series of test current injections to calculate a series of SEI resistance values each associated with a temperature, an injected charge current and a battery state-of-charge (SOC); normalizing the series of SEI resistance values and storing a look-up table; and constructing a polynomial model of SEI resistance as a function of SOC and temperature and current dependent parameters from the look-up table.

Additionally or alternatively, the predetermined model is further derived from the polynomial model by taking a time derivative, and replacing the temperature and current dependent parameters from the look-up table with piece-wise linear model structures.

Additionally or alternatively, the step of adjusting the charging current is performed by: setting a maximum lithium plating boundary; estimating a first battery state of charge at a time instance; using the first battery state of charge and the SEI resistance as inputs to the predetermined model, determining from the predetermined model that the maximum lithium plating boundary has been exceeded and, in response, reducing the charging current.

Additionally or alternatively, the step of adjusting the charging current is performed by: setting an acceptable lithium plating boundary; estimating a first battery state of charge at a time instance; using the first battery state of charge and the SEI resistance as inputs to the predetermined model, determining from the predetermined model that the acceptable lithium plating boundary has not been reached and, in response, increasing the charging current.

Additionally or alternatively, the step of adjusting the charging current is performed by: setting an acceptable lithium plating boundary and a maximum lithium plating boundary; estimating a first battery state of charge at a time instance; using the first battery state of charge and the SEI resistance as inputs to the predetermined model, determining from the predetermined model one of the following: the acceptable lithium plating boundary has not been reached and, in response, increasing the charging current; or the maximum lithium plating boundary has been exceeded and, in response, reducing the charging current; or otherwise maintaining the charging current until at least a next time instance.

Additionally or alternatively, the step of measuring SEI resistance as the vehicle battery is charged is performed by: applying an excitation current to one or more cells of the vehicle battery, the excitation current being applied at two or more frequencies; measuring voltage of the one or more cells responsive to the excitation current at the two or more frequencies; performing a spectral analysis on the measured voltage to determine excitation spectra; and estimating SEI resistance of the one or more cells using the excitation spectra.

Another illustrative and non-limiting example, takes the form of a method of charging a vehicle battery comprising: determining an estimated state of the vehicle battery; obtaining a nominal charge curve from a model for the vehicle battery; updating the nominal charge curve to set and adjust an actual charge curve by detecting lithium plating conditions during charging; using the adjusted actual charge curve to control charging current delivered to the vehicle battery.

Additionally or alternatively, the step of updating the nominal charge curve to set and adjust the actual charge curve by detecting lithium plating conditions during charging is performed by measuring secondary electrolyte-interphase layer (SEI) resistance as the vehicle battery is charged.

Additionally or alternatively, the step of measuring SEI resistance as the vehicle battery is charged is performed by: applying an excitation current to one or more cells of the vehicle battery, the excitation current being applied at two or more frequencies; measuring voltage of the one or more cells responsive to the excitation current at the two or more frequencies; performing a spectral analysis on the measured voltage to determine excitation spectra; and estimating SEI resistance of the one or more cells using the excitation spectra.

Additionally or alternatively, the step of updating the nominal charge curve to set and adjust the actual charge curve is performed by: comparing the estimated SEI resistance to a threshold to determine whether lithium plating is occurring, and: if so, adjusting the actual charging curve down to reduce charging current; if not, adjusting the actual charging curve up to increase charging current.

Additionally or alternatively, the step of updating the nominal charge curve to set and adjust the actual charge curve is performed by storing a correction and limitation logic, responsive to detection of lithium plating during charging.

Additionally or alternatively, the nominal charge curve is derived from a nominal model that contains a set of optimal charge curves computed off-line for a set of operating points of battery SOC defining nominal lithium plating boundaries.

Additionally or alternatively, the nominal model relies on estimates of Li/Li+ overpotential in the battery, and the step of updating the nominal charge curve to set and adjust the actual charge curve by detecting lithium plating conditions during charging is performed by measuring secondary electrolyte-interphase layer (SEI) resistance as the vehicle battery is charged.

Still further illustrative and non-limiting examples take the form of vehicles comprising a motor generator unit (MGU) for providing motive power to the vehicle; a rechargeable battery configured to provide electric power to the MGU; and a charging controller configured to control charging of the rechargeable battery by use of any of the preceding illustrative methods.

This overview is intended to provide an introduction to the subject matter of the present patent application. It is not intended to provide an exclusive or exhaustive explanation. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
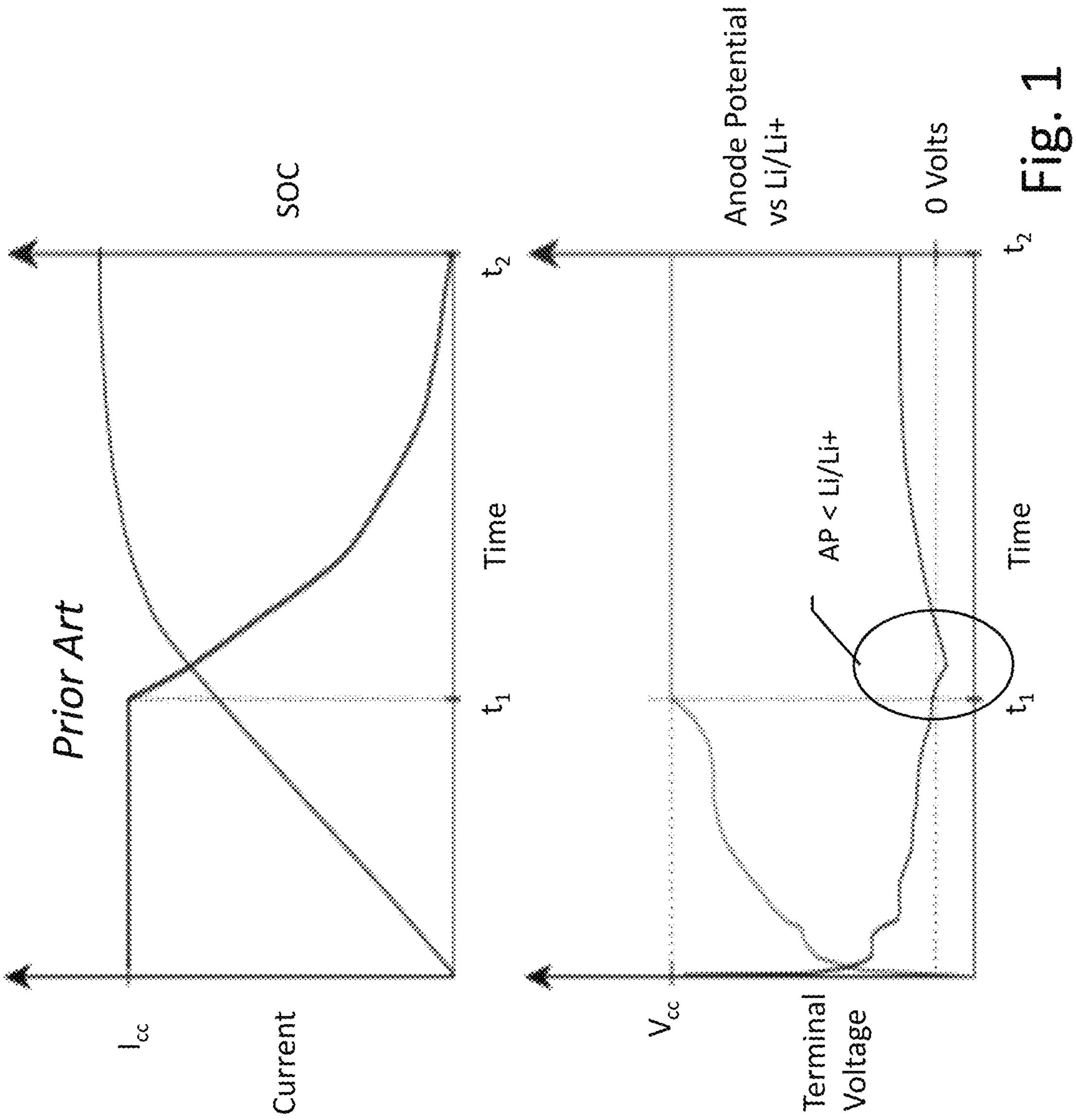
FIGS. 1-2 show illustrative prior art fast charging profiles for BEVs.
Figure 2:
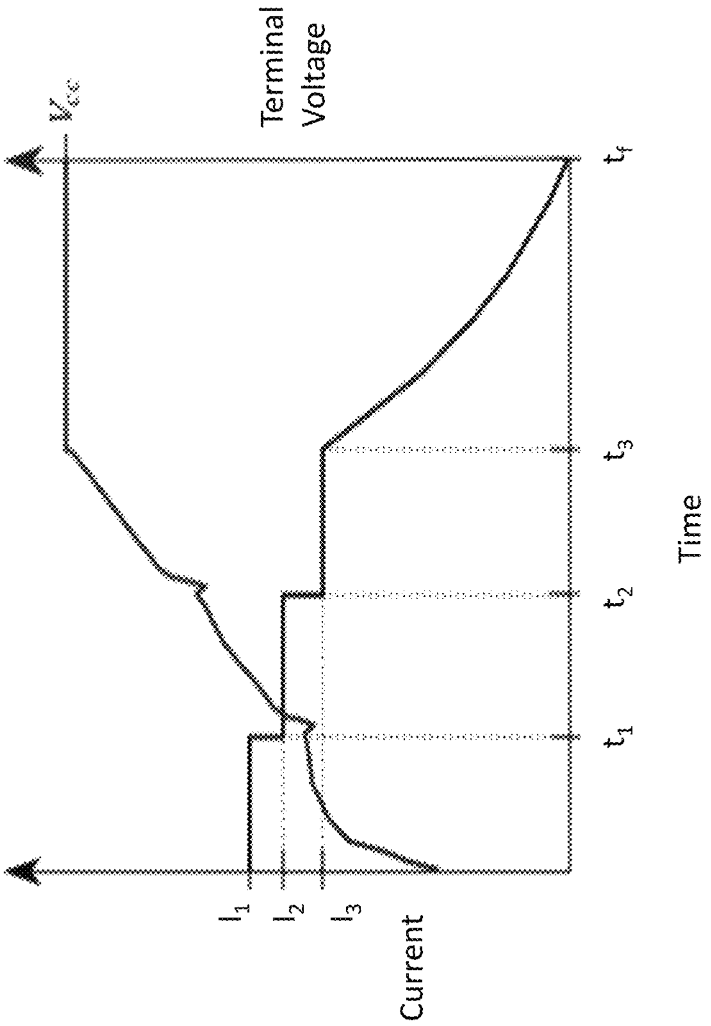
Figure 3:
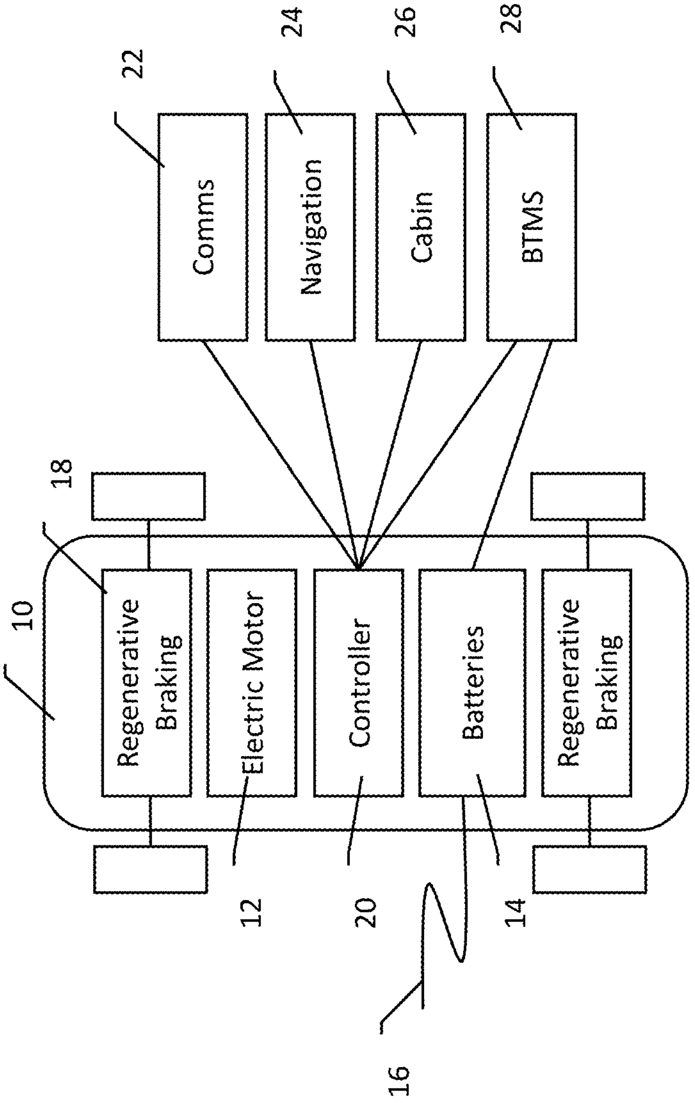
FIG. 3 shows a simplified BEV.

In several illustrative examples, alternatives to and improvements upon the prior art fast charging profiles for BEVs are disclosed. To provide context, first various elements of the system are discussed. FIG. 3 shows a simplified BEV mainly in block form. The skilled person will recognize that the following discussion may not necessarily describe every feature that would be present in the vehicle 10, to avoid excessive exposition of features that are not necessary to understanding the following examples.

The vehicle 10 is characterized by an electric motor 12 (or plural electric motors 12) that provide driving force to the vehicle 10, powered by batteries 14. The batteries 14 are rechargeable by connection 16 to an off-vehicle electricity source, as is known in the art, and may have any suitable chemistry and/or design. Batteries 14 connected to warming and/or cooling apparatuses to maintain suitable temperatures therein, as further explained below. Regenerative braking 18 may be provided, and serves to at least partly recharge the batteries 14 under suitable braking conditions. Though BEVs are the main focus of this discussion, the enhancements discussed herein may also apply, for example, to plug-in hybrid vehicles, for which an engine (not shown) may be included, such as an internal combustion engine or a fuel cell pack. In the appended claims, a battery-electric vehicle, or an electric vehicle, indicates any of a hybrid vehicle having two power systems including at least one that uses a motor and batteries, or an electric-only vehicle lacking a second power source/system.

A controller 20 is coupled to each of these blocks, and may further be linked to control blocks for communications 22, navigation 24, infotainment (not shown), and cabin 26. The controller 20 is configured for sending and receiving information as well as to provide and/or control power used by, for example, an air conditioning unit used for cooling the cabin 26, or other environmental controls for the cabin 26.

The controller 20 may take many forms, including, for example, a microcontroller or microprocessor, coupled to a memory storing readable instructions for performing methods as described herein, as well as providing configuration of the controller 20 for the various examples that follow. The controller 20 may include one more application-specific integrated circuits (ASIC) to provide additional or specialized functionality, such as, without limitation a signal processing ASIC that can filter received signals from one or more sensors using digital filtering techniques. Logic circuitry, state machines, and discrete or integrated circuit components may be included. A skilled person will recognize many different hardware implementations are available for a controller 20. The controller 20 may be part of a computer (desktop, laptop, etc.) provided as part of the system. The controller 20 may include, be part of, or communicate with an advanced control framework as disclosed in U.S. patent application Ser. No. 17/241,668, filed Apr. 27, 2021 and titled ADVANCED CONTROL FRAMEWORK FOR AUTOMOTIVE SYSTEMS, the disclosure of which is incorporated herein by reference.

Communications 22 may include any of satellite, cellular, Bluetooth, broadband, WiFi, and/or various other wireless communications circuits, antennae, receivers, transceivers, transmitters, etc., as desired. The communications 22 may allow the controller 20 to send and receive data relative to one or more internet, dedicated, and/or cloud-based data receiving and/or processing centers, such as a fleet monitor. The communications 22 may be used to upload and/or download data of various types.

The navigation system 24 may store, retrieve, receive, and/or display various types of data including, for example and without limitation, weather/environmental data, road data including curvature, posted speed limits, and grade, as well as traffic data, as desired. The navigation system 24 may also be used to provide route instructions to a driver of the vehicle, and/or to provide a route for an autonomous drive controller to use. The navigation system 24 may include a global positioning system (GPS) device for determining and tracking position of the vehicle 10.

A battery thermal management system, BTMS 28, is also shown. The BTMS controls temperatures in the battery 14 using a cooling system, such as a vapor compression cooling cycle, in which a circulating fluid undergoes phase change to extract heat from the battery and discharge such heat external to the battery system. The BTMS 28 may receive control signals from the controller 20. The controller 20 may include a Battery Management System (BMS) as a sub-system therein, with or without separate hardware. For example, a BMS can be realized as a set of software modules executable on the controller 20, or may be realized as a separate microcontroller, microprocessor, state machine or the like, and associated ASIC, memory, logic or other circuitry.

Figure 4:
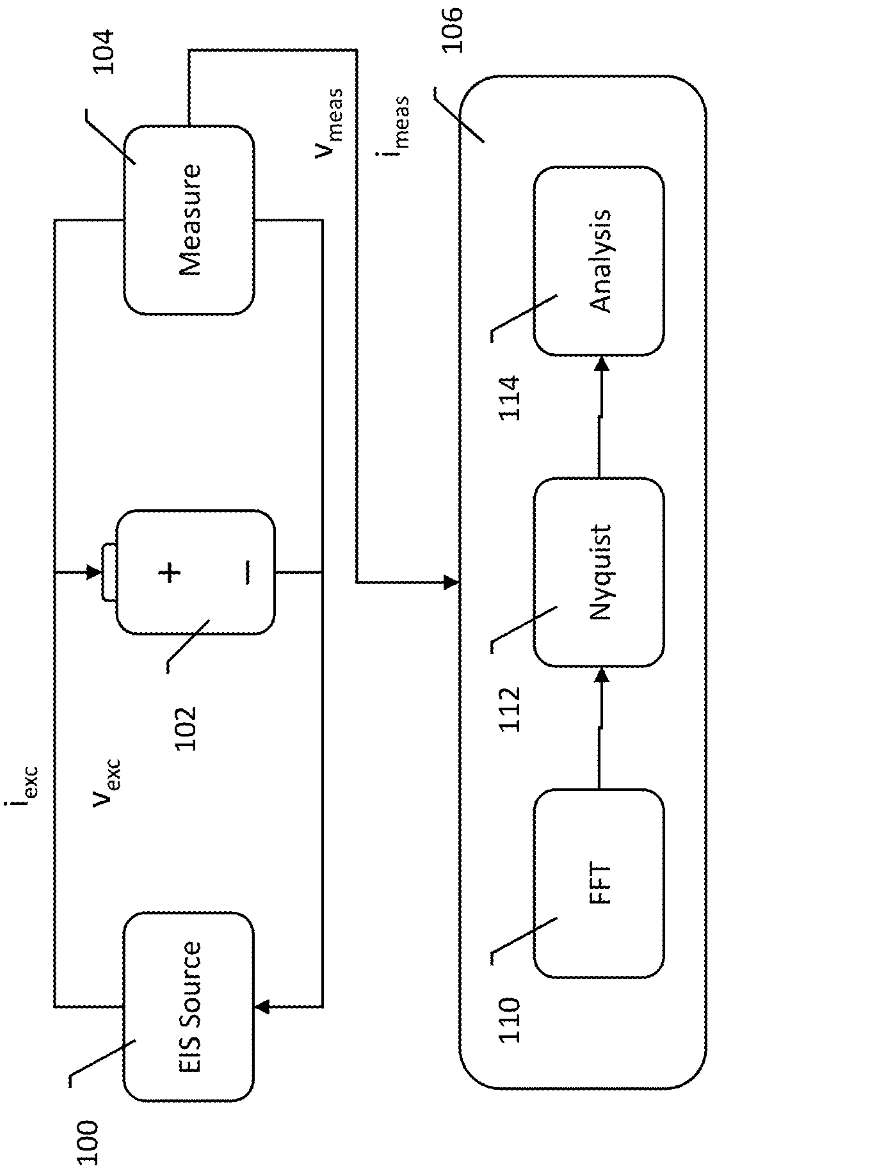
FIG. 4 shows an illustrative battery pack diagnostic system.

FIG. 4 shows a battery pack diagnostic system. An electrochemical impedance spectroscopy (EIS) source 100 provides an excitation signal to a battery 102. The excitation signal can perturbate voltage for Potentiostatic EIS (PEIS), or perturbate current for Galvanostatic EIS (GEIS). Thus, the excitation signal may be an excitation current, $i_{exc}$ (for GEIS) or an excitation voltage $v_{exc}$ (for PEIS). The signal applied is an alternating signal, having a frequency. Measurements of the battery 102 response to the excitation signal are performed by block 104. If the excitation signal is an excitation current, $i_{exc}$, a measured voltage, $v_{meas}$, is obtained; if the excitation signal is an excitation voltage $v_{exe}$, a measured current $i_{meas}$ is obtained. The measurement 104 occurs as the EIS source 100 sweeps through several frequencies or a range of frequencies of excitation signal.

Characteristics of the excitation signal and measured signal are passed to an EIS analysis block 106. A fast Fourier transform (FFT) is performed at 110, and the results populate a Nyquist plot 112. In this process, the complex impedance of a cell or set of cells may be calculated from the current and/or voltage measurement across the frequency sweep. The results are analyzed at block 114.

The analysis at block 114 may take several forms. For example, analysis 114 may simply be to compare parameters, FFT results, etc., across a block of similarly situated cells in a cell module to identify any outliers, indicative of possible failure of any outlier cells. If there are no outliers, the cell module may be deemed as operational. Analysis 114 may compare each cell to stored data based on cells from controlled or laboratory testing, to determine whether cells are performing and/or aging appropriately.

Analysis 114 may instead be used to determine the current state of a cell. For example, with at least some battery chemistries, an OCV measurement may correspond to a wide range of possible SOC. At a given OCV, however, a cell's response to EIS may narrow the range of possible SOC, depending on chemistry, for example. For the purpose of determining SOC, controlled laboratory testing may be used to generate data to which the EIS data can be compared in block 114. EIS may be highly useful for this purpose because EIS enables insight into the internal electrochemical processes and allows ohmic resistance, charge transfer resistance and double layer capacitance, among other characteristics, to be at least indirectly observed. If a lithium chemistry is used in the cell, for example, the EIS may also provide an understanding of lithium plating characteristics and/or SEI formation. The challenge for use in a vehicle is finding ways to perform EIS that are not cost prohibitive or overly power hungry.

An onboard EIS system addressing the power issue for a vehicle is disclosed, for example, in U.S. patent application Ser. No. 18/498,996, filed Oct. 31, 2023, titled SYSTEM AND METHOD FOR ONLINE ELECTROCHEMICAL IMPEDANCE SPECTROSCOPY MEASUREMENT IN A BATTERY, the disclosure of which is incorporated herein by reference. That system or other EIS systems may be used in FIG. 4 and other examples herein to both generate the excitation signal and measure outputs, as desired.

EIS may be augmented by the use of a distribution of relaxation times (DRT) method. DRT is an analysis method for converting impedance data as functions of frequency into a distribution of the time constants in the considered system. DRT can be used to put parameters (time constants, resistance and/or capacitance) into the equivalent circuit for a given system. For example, rechargeable lithium batteries can be modeled using a range of different equivalent circuits, from very a basic resistive model, to first or second order Thevenin electric models, and, most likely for the present examples, the Accurate Electrical Equivalent Model. These may include, for example, one or several series RC circuits, as well as other model components. DRT can be used to apply EIS results to the battery model for a given battery type and build. Chemical traits and structural design at each of the anode, cathode, and electrolyte can be used to select which components of the equivalent model should be understood as being represented in EIS measurements.

Figure 5:
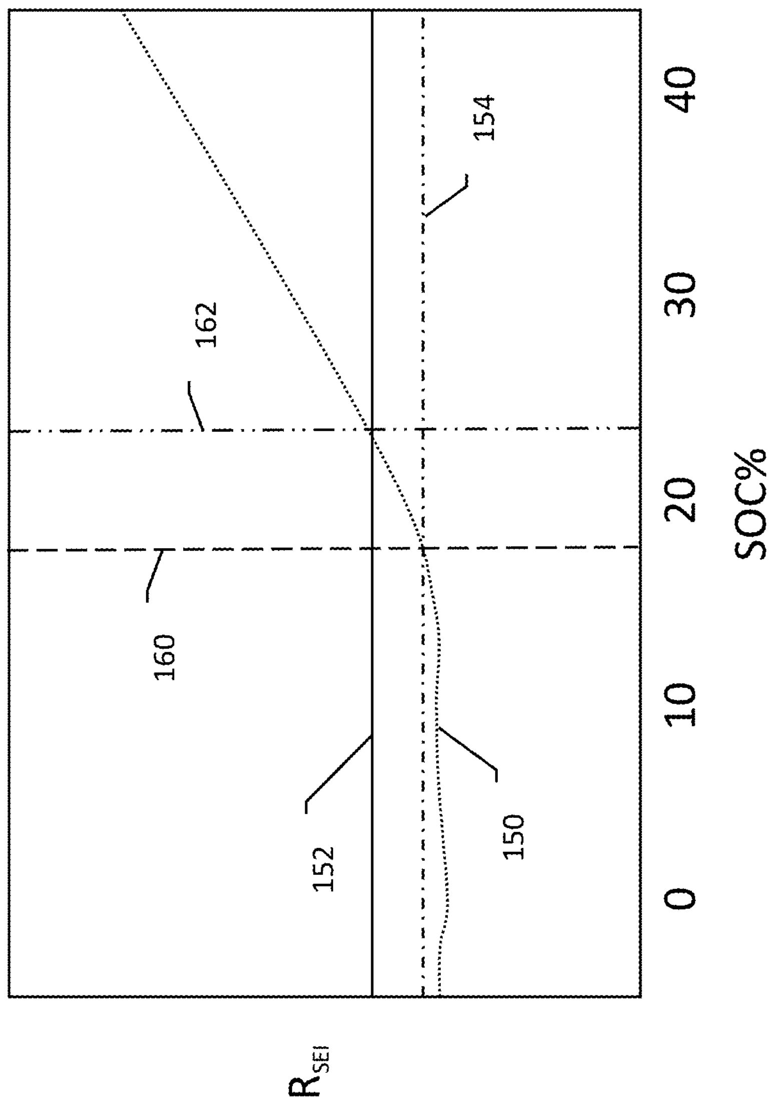
FIG. 5 compares battery state of charge to solid electrolyte interface (SEI) resistance during high current charging.

FIG. 5 compares battery state of charge to solid electrolyte interface (SEI) resistance during high current charging. In the illustration, the measured SEI resistance ($R_{SEI}$) is shown on the vertical axis, and the battery SOC, as a percentage of maximum, is on the horizontal axis, as applied to a rechargeable lithium battery of the type used in a BEV. Graphite SEI resistance increase signals onset of lithium plating inside the battery cell in the graph. The battery tracks line 150 during charging at a fixed C-Rate in this example, and when the battery reaches an SOC a bit under 20%, the line 150 turns upward, indicating onset of lithium plating as indicated by increase in $R_{SEI}$.

Some degree of lithium plating will be acceptable and tolerated in order to use fast charging profiles, and the question for any given battery design and system is how much lithium plating is acceptable. For example, lithium plating can be reversed during battery discharge, as some, but not all, of the lithium plating is stripped away. Empirical data, such as may be developed during battery development, and testing/characterizing, can be used to determine an upper limit of "acceptable" plating growth, shown at line 152 indicating a threshold $R_{SEI}$ above which plating growth is undesirably high, for example, due to exceeding the ability of the battery to strip away excess plating. A lower threshold, 154, indicates that no significant plating is or has taken place below line 154.

The setting of boundary 152 will reflect a weighing of the tradeoffs between desired battery longevity and demands for short charging cycles. Boundary 154, on the other hand, can be understood as indicating the onset of a region in which plating occurs, but is safe and has limited effect on battery longevity. For the hypothetical C-Rate in FIG. 5, SOC boundaries for use thereof are defined at 160 and 162. When SOC is to the left of boundary 160, a higher C-rate can be used if desired to take advantage of the safe zone between

152 and 154, and to the right of boundary 162, a lower C-Rate may be recommended to extend battery life. In some examples, control methods are directed toward charging operations that can keep the charging activity in the safe tunnel between boundaries 152 and 154 throughout a significant portion of the battery SOC range.

In some illustrative examples, battery characterization is performed to set each of a minimum lithium plating limit (MPL)—that is, boundary 154—and an acceptable lithium plating limit (APL)—that is, boundary 152—for use during fast charging operations. The testing approach may include delivering high rate current (in the range 1 C up to about 10 C, such as by selecting three or four operating points therein such as at 2 C, 4 C and 6 C), and measuring $R_{SEI}$ by the use of an EIS measuring system. DRT can be applied to the EIS results to extract and then estimate $R_{SEI}$. The MPL 154 can be set based on the cell's ability to strip plated lithium during discharging, as well as the expected number of charging cycles during the battery's lifetime. The APL 152 can be set using the same factors, that is the cells ability to strip plated lithium during discharging as well as the expected number of charging cycles during the battery's lifetime but with a different possible target/endpoint. For example, one or both of MPL 154 or APL 152 may be chosen that repeated charging below the line offers a desired likelihood of meeting any minimum lifetime warranty or other labeling.

In some examples, a charging operation that is determined, using EIS measurements, to cross the MPL 154 may prompt a communication to the charging system that a lesser charging current is requested, and a charging operation that is determined, using EIS measurements, to cross the APL 152 may lead to charging halt, if desired. In other examples, the APL can be used to prompt a communication for lower charging rate, while charging below the MPL may prompt a communication for a higher charging rate. Other uses can be envisioned. Following is an approach that applies modeling to a control method for fast charging with optimized utilization.

Model derivation may be performed. A temperature loop is defined, as the battery response to injected charge currents will vary in relation to temperature. For example, for each of a plurality of temperatures defined along a grid (i.e. ranging from −20 degrees Celsius to +30 degrees Celsius, at 10 C. intervals, or other range as desired), a series of measurements are taken. The SEI resistance, $R_{SEI}$, is measured using EIS and extracted using DRT for a plurality of charging currents, such as ranging from 0.1 C to 10 C. (for example, 0.2 C, 2 C, 4 C, 6 C). For safety purposes, to avoid thermal runaway, the testing may be stopped at a relatively limited SOC, for example up to about 30% to 40% SOC, if desired. The $R_{SEI}$ measured for each of the locations in the grid can be normalized using an $R_{SEI}$ value taken at 0% SOC (or other preset SOC), as shown in Equation 1:

$$R_{SEI,r,dat} = \frac{R_{SEI,dat}}{R_{SEI,0}} \quad \{1\}$$

Figure 6:
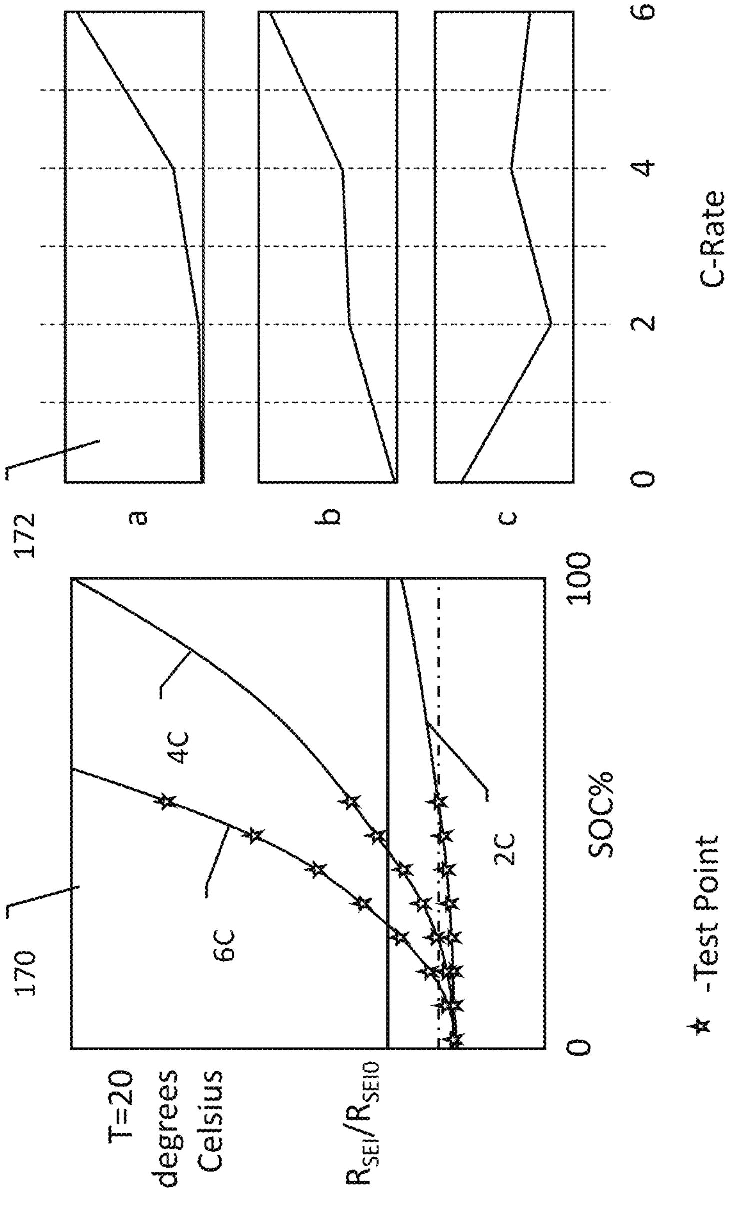
FIG. 6 illustrates influence of high current levels on relative SEI resistance.

Each of these relative resistances can then be fit, for a given temperature and current, into a polynomial model. In some examples, a second order model is used as in Equation 2:

$$R_{SEI,r} = a_{LUT}SOC^2 + b_{LUT}SOC + c_{LUT} \quad \{2\}$$

Where the a, b, and c parameters are temperature and current dependent parameters stored in look-up tables (LUT). FIG. 6 shows an illustrative example of the results; indicating as well the influence of high current levels on SEI resistance. At 170, the test data is illustrated for a given temperature in the temperature grid (T=20 degrees Celsius), with each star indicating a test point. The resulting values for a, b, and c, are shown at 172, varying in response to current as shown for the given temperature.

Next, a model is derived by taking the time derivative of $R_{SEI}$ to provide a dynamic model of relative SEI resistance growth in the form shown in Equation 3:

$$\dot{R}_{SEI,r} = \frac{\eta * 100}{C_B * 3600} * I * [2a_{LUT}(T, I) * SOC + B_{LUT}(T, I)] \tag{3}$$

Where η is the battery charging or discharging efficiency (rated, labeled, or experimentally derived), I is the charging current, T is the core temperature of the battery, $C_B$ is the battery capacity, and SOC is the state of charge. The numerical terms 3600 (converting hours to seconds) and 100 (converting % to decimal) may be chosen differently for different unit formulations, as desired.

System model variables are then introduced as follows as shown in Equations 4-7:

$$x_1 = R_{SEI,r} \tag{4}$$

$$c = \frac{\eta * 100}{C_B * 3600} \tag{5}$$

$$x_2 = SOC \tag{6}$$

$$u = I \tag{7}$$

Introducing the system model variables, at a given core battery temperature, leads to the following as the control-oriented model defining the system model dynamics:

$$\dot{x}_1 = c * u * [2 * a_{PWL}(u) * x_2 + b_{PWL}(u)] \tag{8}$$

$$\dot{x}_2 = c * u \tag{9}$$

Where the gains, $a_{LUT}$ and $b_{LUT}$ have been parameterized as piece-wise linear model structures $b_{PWL}$ and $b_{PWL}$ for use in Equation 8.

Figure 7A:
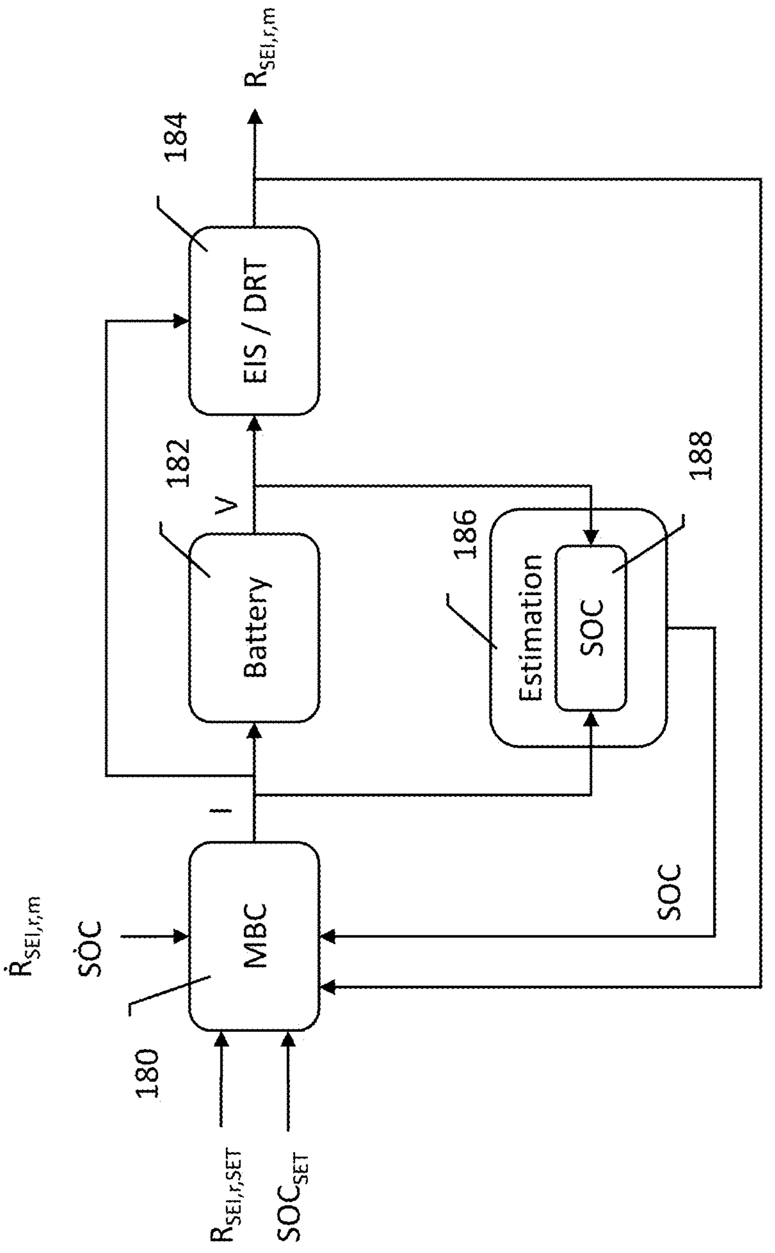
FIGS. 7A-7B show, in block form, charging control architectures.
Figure 7B:
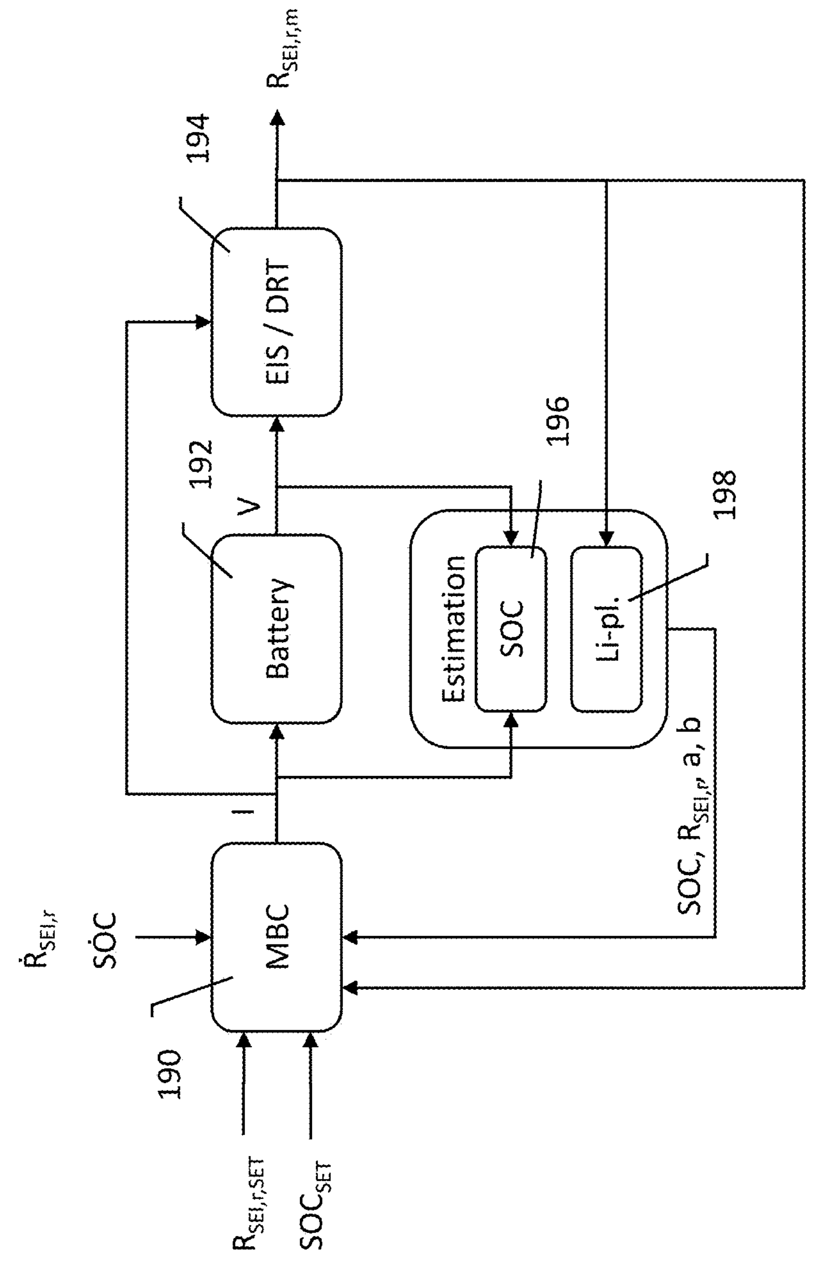

FIGS. 7A-7B show, in block form, charging control architectures for implementing the preceding. The model-based controller (MBC) 180 uses equations 8 and 9 to represent the change in relative SEI resistance and SOC, respectively. Two states are measured and delivered to the MBC 180, the relative SEI resistance, $R_{SEI,r}$, and the SOC. The MBC further expects the setpoints for given states to be given as the MPL value and the $SOC_{SET}$, which may be 100% in some examples. The battery 182 receives current, I, as it charges, and a voltage measurement, V, is obtained from the battery during charging. EIS/DRT block 184 performs EIS testing and generates the $R_{SEI,r,m}$ measurement for return to the MBC. The estimation block 186 generates an SOC estimate using the measured voltage from the battery and the injected current, and provides the SOC estimate to the MBC, as illustrated. For example, estimation block 186 may use as SOC estimation block 188 a Kalman Filter, or a coulomb counter, in various examples. If coulomb counting is used, the SOC estimate 186 may need to be updated from time to time as the battery ages and loses charge capacity.

FIG. 7B shows another example. The model-based controller (MBC, 190) uses equations 8 and 9 to represent the change in relative SEI resistance and SOC, respectively. Two states are measured and delivered to the MBC 190, the relative SEI resistance, $R_{SEI,r}$, and the SOC. Model gains $a_{PWL}$ and $b_{PWL}$ are also provided to the MBC; some examples may omit parameterization and instead use LUT values for a and b, if desired.

In FIG. 7B, MBC 190 further expects the setpoints for given states to be given as the MPL value and the $SOC_{SET}$, which may be 100% in some examples. The battery 192 receives current I as it charges, and a voltage measurement is obtained from the battery during charging. EIS/DRT block 194 performs EIS testing and generates the $R_{SEI,r,m}$ measurement for return to the MBC. The estimation block now includes each of an SOC estimator 196, and a Lithium Plating Estimator 198. The Lithium Plating Estimator 198 may be a model-based estimator using, for example, Equations 8-9 to filter measurement of SEI resistance. Items 196 and 198 may be jointly estimated using, for example, an extended Kalman filter (EKF), or a moving horizon observer (MHO), to estimate each of the $R_{SEI,r}$ and SOC values. That is, for example, the model developed above and reflected in Equations 8 and 9 can be applied directly in the EKF for filtering purposes.

Figure 8:
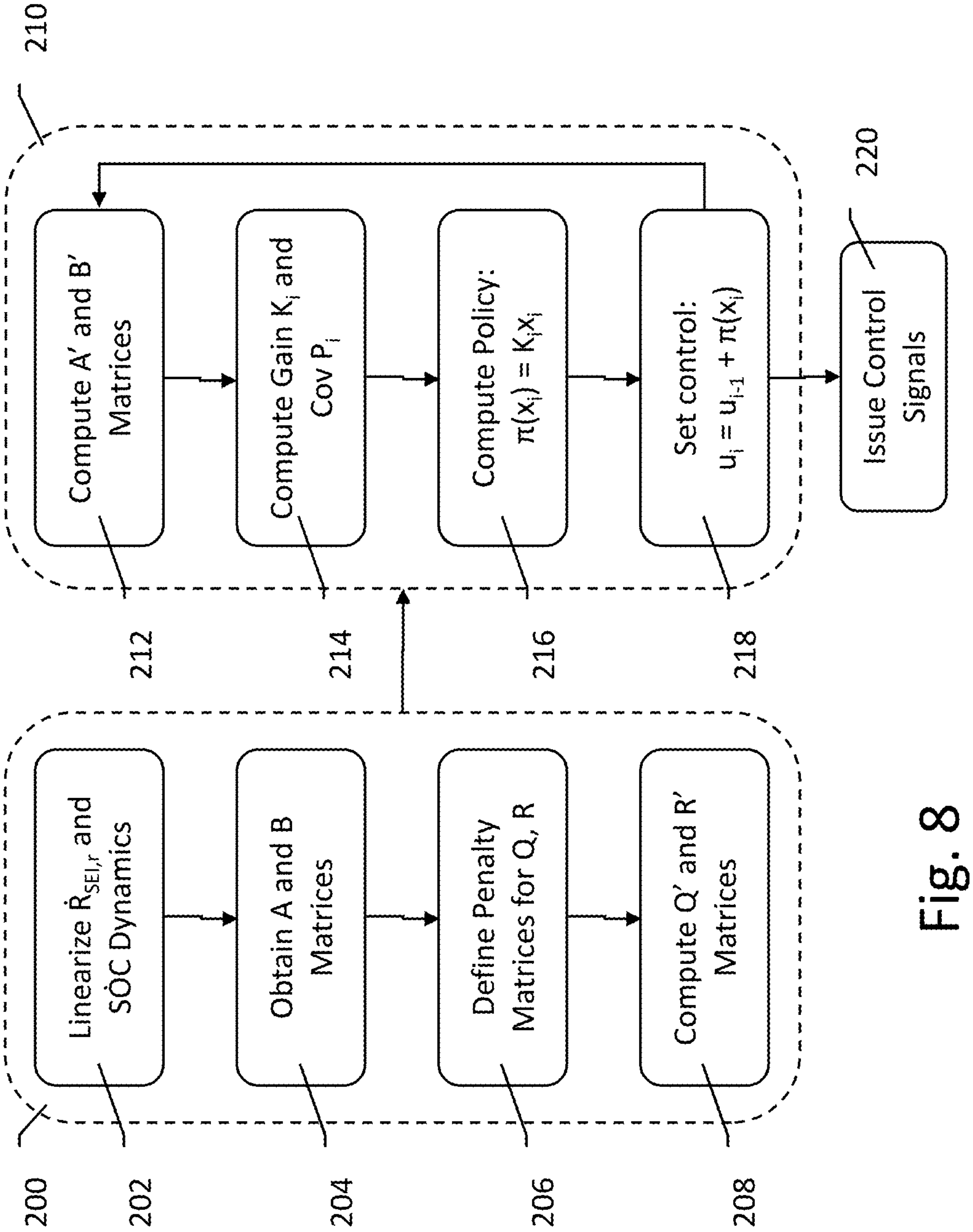
FIG. 8 shows, in block form, a control method.

FIG. 8 shows, in block form, a control method. In this approach, the above models from Equations 8 and 9 are applied using a linear quadratic controller design. Other advanced techniques, including non-linear model predictive control or a dynamic programming approach may be applied to compute optimal charging profiles in fashion generally similar to the following example.

Block 200 represents an initialization sequence. An iterated linear quadratic (iLQ) controller design is shown. First, the model dynamics in Equations 8 and 9 are linearized, as indicated at 202. Analytical expressions for the A and B matrices of the iLQ controller are then obtained, at 204. For example, a standard linear quadratic approach may be used:

$$x_{t+1} = Ax_t + Bu_t \tag{10}$$

$$g(x_t, u_t) = x_t^\top Qx_t + u_t^\top Ru_t \tag{11}$$

Next, introducing change in controls factor, Δu:

$$\begin{bmatrix} x_{t+1} \\ u_{t+1} \end{bmatrix} = \begin{bmatrix} A & B \\ 0 & I \end{bmatrix}\begin{bmatrix} x_t \\ u_{t-1} \end{bmatrix} + \begin{bmatrix} B \\ I \end{bmatrix}\Delta u_t \tag{12}$$

Which may be rewritten as:

$$x'_{t+1} = A'x'_t + B'u'_t \tag{13}$$

Then the cost can be defined as:

$$\text{cost} = -(x'^\top Q'x' + \Delta u^\top R'\Delta u) \tag{14}$$

Penalty matrices for the state, Q, and input change, R, for the iLQ controller are next defined, as indicated at 206. And the Q' and R' matrices are then computed, as indicated at 208. Thus:

$$Q' = \begin{bmatrix} Q & 0 \\ 0 & R \end{bmatrix} \quad \{15\}$$

The R' variable can a definable penalty for change in controls. If R' is set to zero, then the iLQ would be a standard linear quadratic regulator (LQR).

The method shifts to control block 210. The iLQ state-feedback controller can be that designed for linear time-varying systems. The A' and B' matrices are first calculated, at 212 using the A and B matrices from 204. The gain and covariant, Ki and Pi, are computed at 214 by setting $P_0=0$ is set, and for each of i=1, 2, 3 . . . , using:

$$K_i = -(R_{H-1} + B_{H-i}^{\top} P_{i-1} B_{H-i})^{-1} B_{H-i}^{\top} P_{i-1} B_{H-i} \quad \{16\}$$

$$P_i = Q_{H-i} + K_i^{\top} R_{H-i} K_i + (A_{H-i} + B_{H-i} K_i)^{\top} P_{i-1} (A_{H-i} + B_{H-i} K_i) \quad \{17\}$$

The optimal policy for an i-step horizon is given at block 216 by:

$$\pi(x) = K_i x \quad \{18\}$$

The cost-to-go function for an i-step horizon is given by:

$$J_i(x) = x^{\top} P_i x \quad \{19\}$$

As shown at 218, the optimal policy is used to set the next control action from the last control action. The control signals, u, are then issued as indicated at 220.

Figure 9:
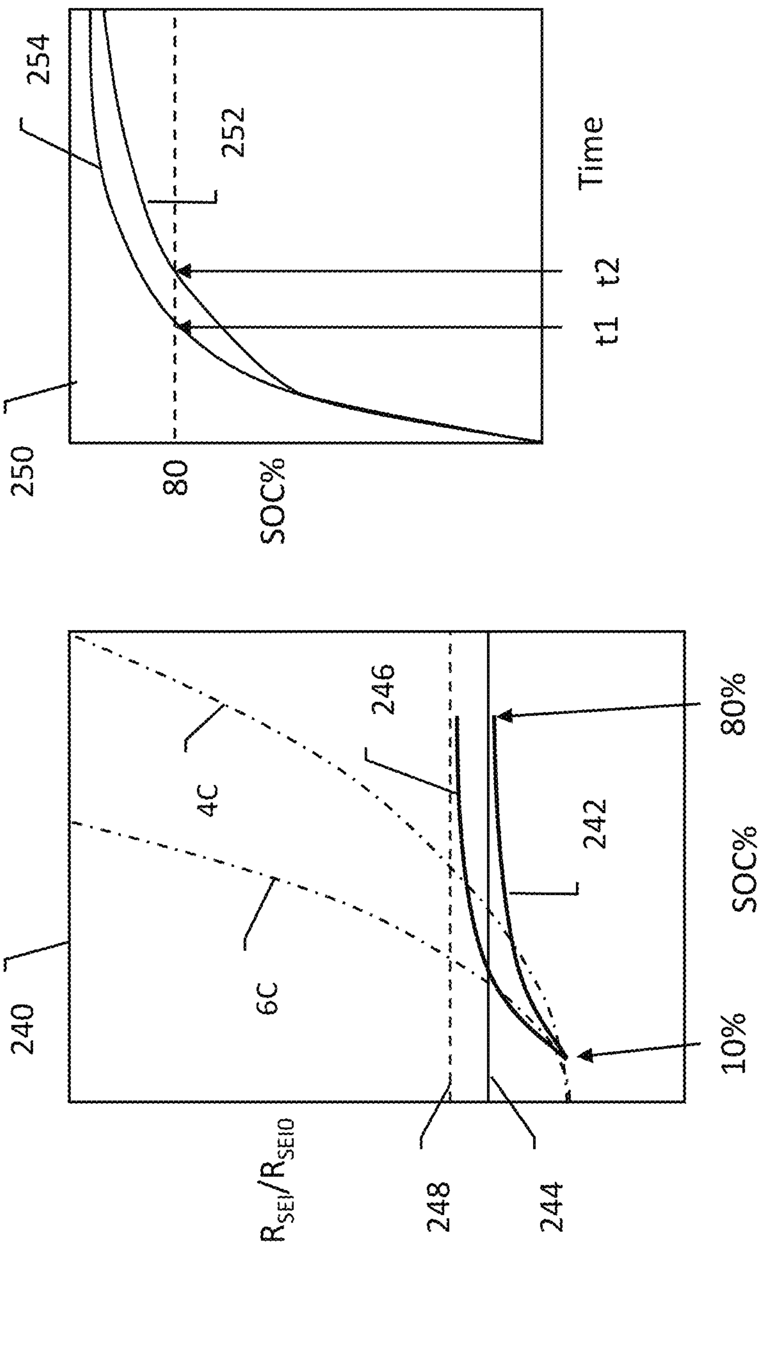
FIG. 9 illustrates results of controlled charging using different tunings.

Taking the iLQ state feedback example and applying to a simulation on an Li battery using typical characteristics shows that the process works and is responsive to different tunings. FIG. 9 illustrates simulated results of controlled charging using different tunings. SOC is compared to the normalized $R_{SEI}$ at graph 240, and SOC is compared to time at graph 250. A first charging curve at 242 is tuned using a first APL 244, and a second charging curve at 246 is tuned using a second, higher APL 248. With the higher APL, a greater amount of $R_{SEI}$ growth is allowed. As shown at 240, the control method keeps the charging curves 242, 246 below their respective APLs 244, 248. As indicated at 250, charging curve 252, corresponding to curve 242, takes longer to reach the SOC target of 80% than the charging curve 254 that corresponds to curve 246.

Figure 10:
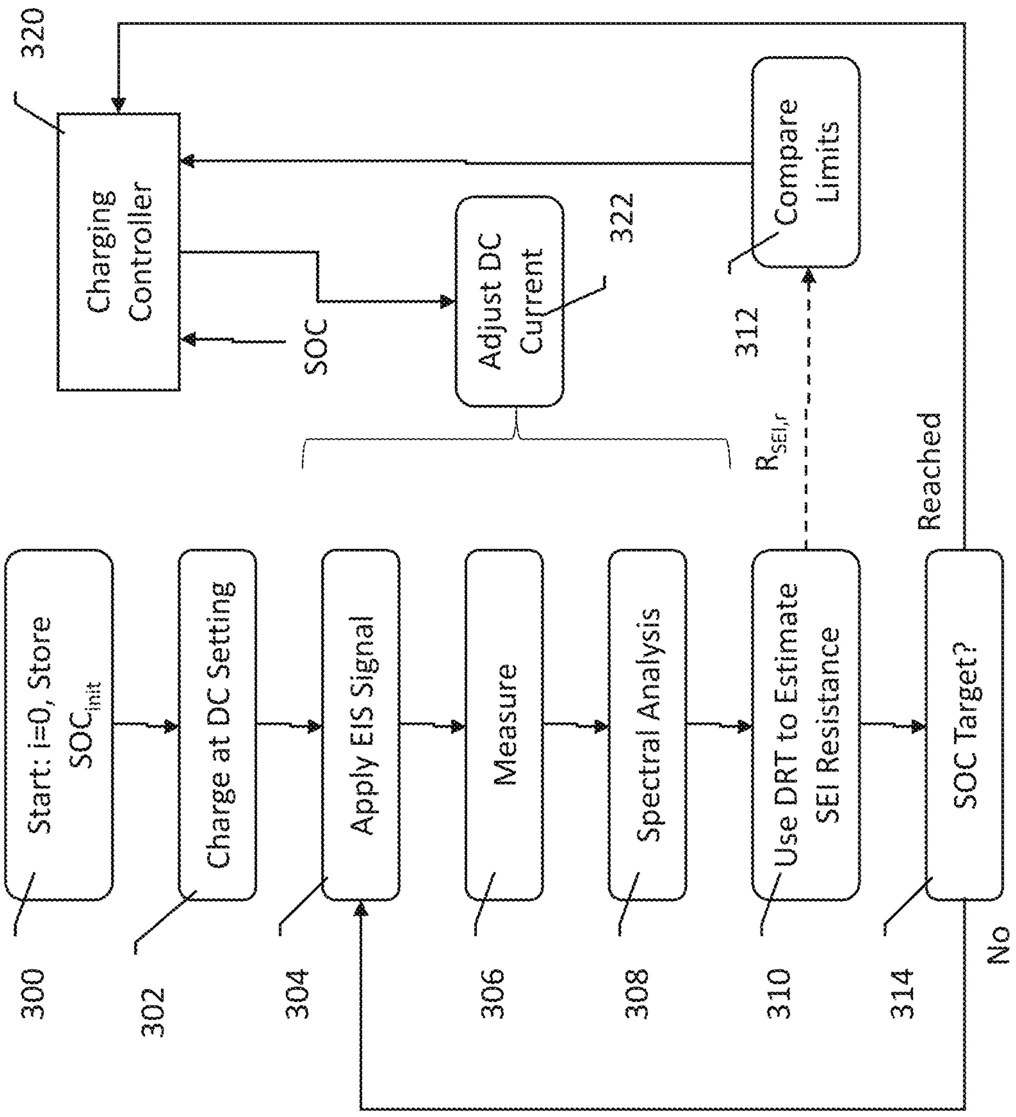
FIG. 10 illustrates a charging control method using electrochemical impedance spectroscopy (EIS)

FIG. 10 illustrates a charging control method using electrochemical impedance spectroscopy (EIS) in accordance with the preceding. At an initialization time, i=0, the initial state of charge ($SOC_{init}$) is stored, as indicated at 300. Charging commences at a DC current setting, as indicated at 302. The DC current may be, for example, anywhere from 1 C to 10 C, for example, 7 C. Step 300 may have as a predicate ensuring that the battery is in an appropriate temperature range for such charging current levels, neither too high nor too low, depending on the battery structure and chemistry. If needed, preconditioning may take place before step 302.

As the DC charging continues, an EIS signal is applied at 304, using either an excitation current or excitation voltage, which may be generated as described above. Measurement of the battery response to the EIS signal is next, at 306, using a voltage measurement if the EIS signal at 304 is a current, or a current measurement if the EIS signal at 304 is a voltage. Spectral analysis 308 is performed, using for example, a fast Fourier transformation or other frequency-based analysis as desired. The results of the spectral analysis from 308 go through a DRT analysis to estimate SEI Resistance at block 310, including the relative SEI resistance ($R_{SEI,r}$) that compares to the baseline (which may also be stored at block 300 or in a first iteration of the method). The calculated $R_{SEI,r}$ is compared to limits at 312 to determine whether any of the $R_{SEI,r}$ limits, for example shown in FIG. 9, are being approached or crossed, at 312.

The outcome of this comparison at 312 is communicated to the charging controller 320, which also receives the battery SOC during charging. The charging controller 320 uses the returned values of SOC and $R_{SEI,r}$ to determine whether to increase or decrease the DC setting current, which can be revised external to the iterating loop by the charging controller 320. The method then determines whether the SOC target has been reached for the battery at block 314; if not, the method iterates to 304 where another EIS signal is applied. If desired, the return to block 304 may be time limited so that it occurs, for example, once every 1 to 20 seconds. Once the SOC target is reached, the method terminates and signals completion of the DC charging period to the charging controller 320, which can indicate that the target SOC (usually, but not limited to, 80%); if further charging is desired, constant voltage charging may commence, for example, or any other suitable steps can take place. The charging controller 320 thus adjusts the DC current applied, as indicated at 322, using updated values of $R_{SEI,r}$ generated within the loop (304/306/308/310/314) until the SOC target is reached.

In an illustrative example, the system executes a method of charging a vehicle battery. First, at block 300, determining an estimated state of the vehicle battery. This may include, for example, using vehicle battery history data is performed including, in the example, storing an initial SOC for the battery. The initial SOC, as well as other factors that may include battery state-of-health, existing lithium plating boundaries/measurements, battery age and/or battery capacity may be measured, modeled, or determined using the battery history data. Then, at block 302, initiating charging of the vehicle battery at a charging current determined from a predetermined model for charging the vehicle battery is performed. The predetermined model includes, in the example, a plurality of modeled secondary electrolyte-interphase layer (SEI) resistance values. As charging is executed, at blocks 304-308, the method then includes measuring SEI resistance as the battery is charged. Using the SEI resistance, which can be adjusted/corrected using DRT, the system compares to preset limits at 312 in order to adjust the charging current to enable the measured SEI resistance to track the modeled SEI resistance values. This last adjustment step is performed outside the iterative loop in the example of FIG. 10, as charging controller 320 adjusts charging current at 322.

The adjustments made by the charging controller 320 may include using the battery SOC, as shown in FIG. 10. In an example, the step of adjusting the charging current is performed as shown in FIG. 9. The system sets a maximum lithium plating boundary as shown at 248 (which may be in relative terms), estimates a first battery state of charge at a time instance (SOC is provided to the charging controller 320 as shown in FIG. 10; the first battery SOC may be asynchronous to the iterative loop in FIG. 10, so that the most recent battery SOC available at the time instance is used. Next, using the first battery state of charge and the SEI resistance as inputs to the predetermined model, the method determines that the maximum lithium plating boundary (248 in FIG. 9) has been reached or exceeded and, in response, the method reduces the charging current, which is apparent from the flattening of the curves 254/252 in FIG. 9. This downward adjustment can also be observed as line 246 crosses the 6 C curve and then the 4 C curve, while not moving upward in a significant way along the normalized/relative SEI scale. Thus in this approach, the acceptable placing boundary 244 may be omitted, if desired, though this is not necessary as further noted below.

In another example, the charging current adjustments are performed by setting an acceptable lithium plating boundary, such as the lower boundary 244 in FIG. 9. Again, the first battery state of charge at a time instance is estimated, whether by measurement, monitoring or modeling, for example. In this method, next, using the first battery state of charge and the SEI resistance as inputs to the predetermined model, the system/method determines that the acceptable lithium plating boundary has not been reached and, in response to the acceptable lithium plating boundary not having been reached, the method may increase the charging current. This can be achieved as shown in FIG. 9 by moving from the 4 C curve to the 6 C curve, as indicated toward the left end of line 246, before line 246 crosses line 244. In this approach, the maximum plating boundary 248 may be omitted, if desired.

In another example, the charging current adjustments use both the maximum plating boundary 248 and the acceptable plating boundary 244. Here, the method sets an acceptable lithium plating boundary and a maximum lithium plating boundary. The battery SOC is again obtained, measured, modeled or otherwise estimated at a time instance. In the method, using the first battery state of charge and the SEI resistance as inputs to the predetermined model, the next step is to identify which of three conditions or states the system is in, as determined from the predetermined model. One condition is when the acceptable lithium plating boundary has not been reached and, in response to the acceptable lithium plating boundary not having been reached, the method/system increases the charging current. Again this can be observed as curve 246, at its left end, crosses from the 4 C line up beyond the 6 C line. When the maximum lithium plating boundary has been exceeded, in response, the charging current is reduced. This occurs as the curve 246 crosses or is at the maximum lithium plating limit 248. If operating between boundaries 244 and 248, the method can simply maintain the charging current until at least a next time instance.

It may be noted that line 246 is shown as not exceeding the boundary at 248 in FIG. 9. This is an approximation for purposes of the example. In an operating method, the line 246 may not be as smooth as shown, and may be more of a sawtooth shape, exceeding line 248 and then dropping back below line 248 with each reduction in the charging current. In another method, the upper boundary 248 may be used along with a safety margin, keeping line 246 below the boundary 248, and so exceeding, meeting or crossing the maximum lithium plating boundary may mean exceeding the safety margin set below (or, in a more aggressive charging case, at or even above) the actual maximum lithium plating boundary 248.

The preceding examples rely on the use of the EIS to identify, through sensing, the onset of lithium plating conditions, and respond to such sensed conditions by reducing the charging current within selected boundaries. Another series of examples follow which begin with a model of the Li/Li+ overpotential conditions, which form a plating boundary. This model is adjusted online by correction or limitation logic, and proceeds to drive charging currents so the boundary of the Li/Li+ overpotential condition, assuming that this will provide faster charging without undue damage to battery life.

The process starts with a nominal Doyle-Fuller-Newman-based battery model, which may be referred to as well as a pseudo-two-dimensional (P2D) model. Other model types, including microscale-partial-differential-equations, single particle model, or reduced order models may be used as the starting nominal model. The model may be calibrated off-line and/or through external measurements, and used to estimate a plating boundary and corresponding current to be pre-computed for different battery SOC, temperatures, initial SOC, maximum currents, and/or battery state of health (SOH).

The "plating boundary" indicates a set of circumstances (current delivered into a given SOC at a given temperature, with further influences) under which lithium plating is happening. The plating boundary is dynamic in nature, influenced by SOC and temperature, but also responding to SOH and other factors. In the following examples, the plating boundary is estimated, starting from a nominal model with various corrections/adjustments, and a charging current is delivered such that the plating boundary is not crossed. By keeping the charging current close to the plating boundary, one may maximize the charging current delivered, thus reducing charging time without unduly affecting battery performance or SOH.

One of the adjustments used to estimate the plating boundary is that the nominal model is monitored using an online plating detection method, such as using the EIS method with DRT as in the previous examples, and/or, alternatively, using a voltage-relaxation plateau-phenomena augmented by a differential voltage analysis, if desired. In some examples, the online plating detection method provides a correction signal, modifying the nominal model by, for example, a table of corrections which can be used to downgrade or upgrade charging current, as further detailed in the following illustrations.

Figure 11:
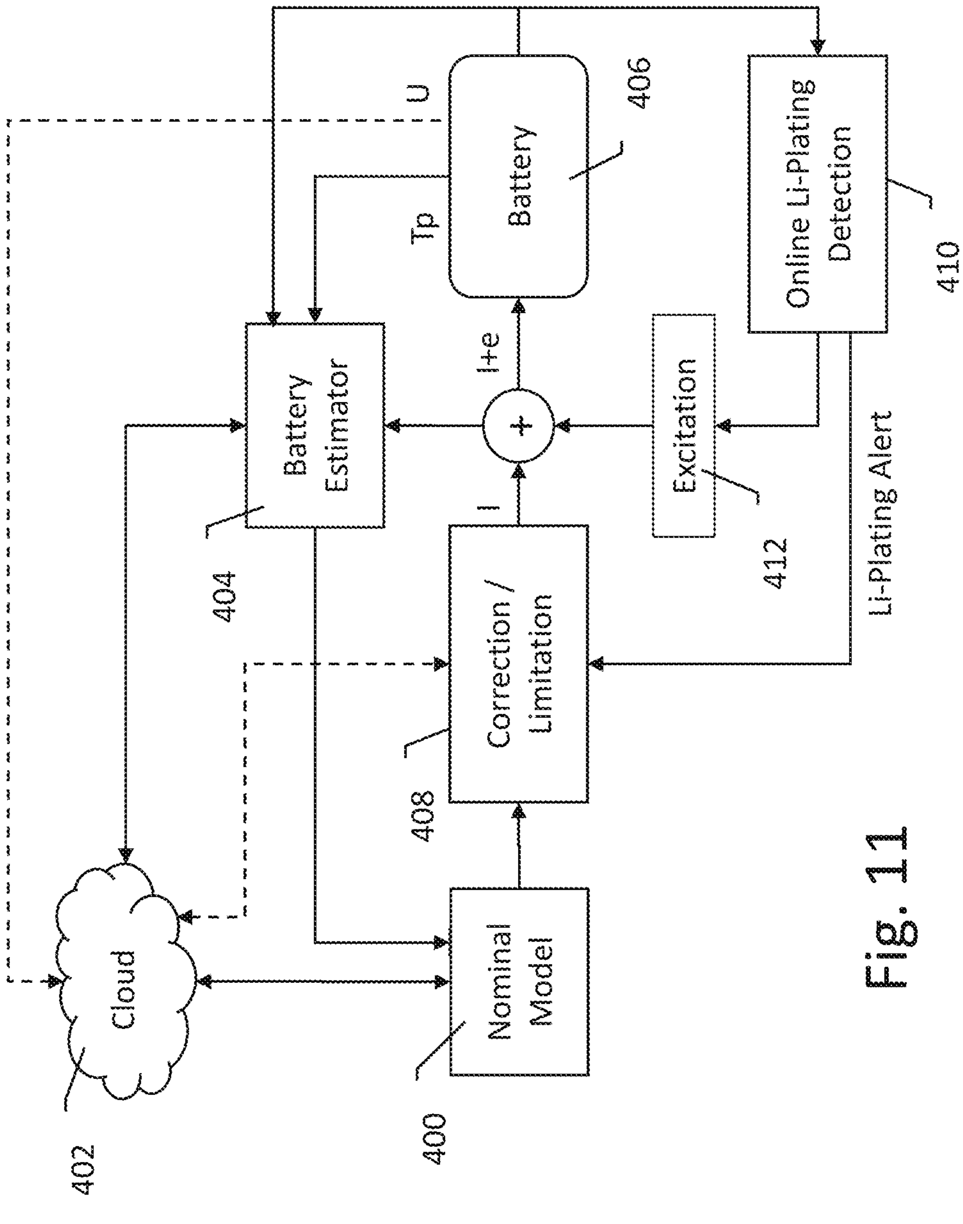
FIG. 11 shows an illustrative process flow and communications between subparts of the system.
Figure 12:
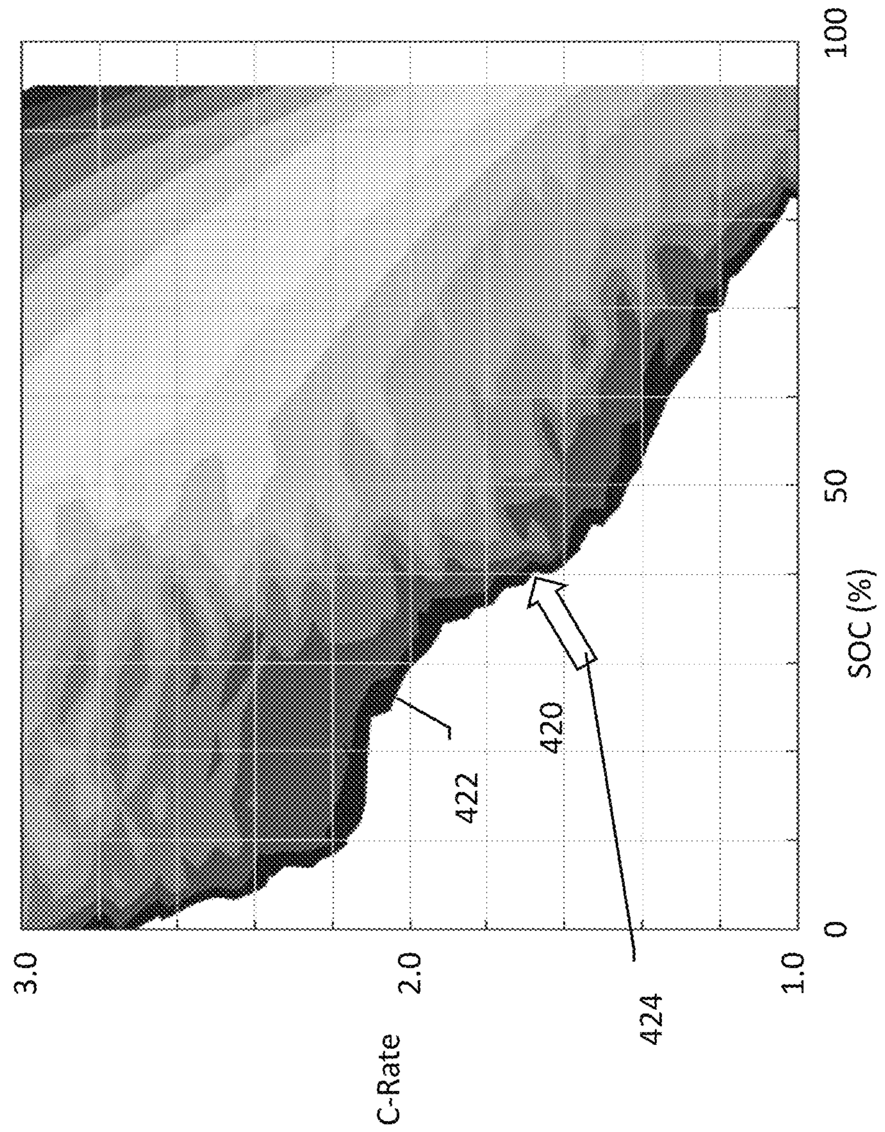
FIG. 12 graphically illustrates a plating boundary condition estimate.

FIG. 11 shows an illustrative process flow and communications between subparts of the system. The charging solution assumes that by using charging currents that drive the Li/Li+ overpotential close to the lithium plating boundary (FIG. 12 provides a graphical example and explanation), one may maximize charging current and thus reduce charging time considerably, while not causing damage. The charging solution includes a nominal model 400, an online correction and/or limitation logic 408, and an online lithium plating detector 410. The nominal model 400 provides an assumed plating boundary (see FIG. 12) which will also imply a nominal charging strategy, that will suffer from modeling inaccuracies, manufacturing inconsistencies and effects of aging. The nominal model 400 may include considerations of current battery state, obtained from battery measurements and/or the battery state estimator 404. Therefore, this nominal model 400 is corrected by a correction logic 408, in particular when lithium plating is detected 410. A Li-Plating Alert is provided to the correction logic 408 by a method that can identify Lithium plating from available signals, such as the voltage response of a battery cell in the time or frequency domains (for example, using EIS as described previously in relation to FIG. 4).

The nominal model 400 assumes that a model of the internal electrochemical phenomena occurring in battery cells can be computed using numerical tools. For example, the model may return the Li/Li+ reference voltage or the plating current at which the Li/Li+ reference is estimated to cross a limit. The correction logic 408 then modifies a plating boundary obtained from the nominal model and thus provides an optimal/enhanced charging curve under various conditions.

The nominal model 400 can be calibrated either offline or through measurements in the "cloud" 402—that is, at a remote computing system or server, for example. The solution of these models may be resolved, for example, a single time offline, or repeatedly in the cloud 402, as desired. The model solution is communicated from cloud 402 to the nominal model 400, and may be based on measurements obtained from the battery 406. The model solution may be calculated using, for example, by commercial (GT AutoLion, COMSOL, Multiphysics, etc.) or open solvers (PyBaMM or others). The offline plating boundary and corresponding current can be potentially pre-computed for different SOC, temperatures, initial charging SOC, maximal applicable currents, battery SOH, etc., and communicated and or stored as data tables, for example and without limitation.

The safe charging current, based on the solved boundary, is applied to the battery 406 as a feed forward control strategy via the combination of nominal model 400 and correction block 408 inputs. Due to the highly non-linear, dynamic and complex nature of the boundary, the correct charging curve is selected from a set of pre-computed data based on information measured and estimated outside of the quick charging strategy. The measured or estimated information may include but is not limited to SOC, initial starting SOC at the beginning of the charging procedure, temperature, SOH, and others. This nominal model 400 (based on the offline or cloud-based solution 402) is then constantly monitored by the online Li plating detector 410. The online nature of this algorithm implies that it is effective throughout the charging process and/or closely after, and may be referred to as an in-operando strategy. Block 410 may, as noted use EIS and DRT as described in earlier examples to observe plating phenomenon. Block 410 may instead use a voltage relaxation plateau (VRP) phenomena augmented by a differential voltage analysis (DVA) or others.

Block 410 may supply an excitation signal 412 to the charging procedure, for example, to support the EIS or other plating phenomenon detection method, such that the current applied at the battery 406 includes both charging current and any excitation current. In some examples, the excitation signal from 412 may be generated within the battery pack's circuitry, such as by a battery management unit or other sub-system in the battery 406 or elsewhere.

Under certain operating conditions, block 410 may issue a Li-Plating Alert to the correction logic 408. If triggered, the alert may be launched periodically throughout the charging process, continuously, or even after the completion of the charging process. The realization of the alarm can be a continuous scale signal expressing a confidence in the plating detection (0 1), a binary signal (0/1) or even an observed direct or indirect cell state such as Li/Li+ overpotential or estimated plating current. The alert is issued to the correction logic 408, which can in turn modify the offline charging current solution from the nominal model 400. For example, the correction logic 408 may responsively, periodically or continuously update a table of corrections that are imposed on the nominal model 400. The correction logic 408 may downgrade or upgrade the charging current, depending on the alert or other data communicated from the plating detector 410. A forgetting mechanism may also be used in block 408 so that the effect of any alert, once the alert ceases, is removed over time. The data in the table of corrections may be communicated back to the cloud 402 as desired for fleet diagnostics, and/or for tuning of the nominal model, for example and without limitation.

The battery estimator 404 may be used to obtain data regarding the current state of the battery 406 as well as tracking battery SOH over time, and battery SOC which may be estimated and/or monitored using a coulomb counter. For example, pack temperature, Tp may be obtained from temperature sensors associated with the battery. The battery estimator may track charging and discharging currents in relation to the battery 406 to not only estimate current SOC, but may also track errors (or other residuals) such as by use of a Kalman filter, to estimate lost capacity in the battery 406 over time, to further inform estimates of SOH. Other and/or additional methods may be used.

FIG. 12 graphically illustrates a plating boundary condition estimate. The graph 420 shows SOC as the horizontal axis, and C-Rate on the vertical axis. A boundary 422 indicates a level of safe charging as a combination of SOC and C-Rate. To the right of boundary 422 are charging circumstances that are estimated to cause lithium plating, and to the left of boundary 422 are safe charging conditions. As indicated at 424, the general idea is to push charging current close to the boundary 422, thereby maximizing charging current without causing damage. The boundary line 422 is also sensitive to other conditions, including, for example, battery SOH and battery pack temperature. Further, EIS or other testing is used to monitor the actual battery and thereby adjust boundary line 422 as needed to modify the model shown to match actual performance.

Referring briefly back to FIG. 11, in an illustrative example, the nominal model 400 contains of a set of optimal charge curves that are computed for a pre-determined set of operating points. Optimal charge curves are functions mapping actual, measured/calculated SOC, to charge currents that keep the internal state of the battery at the boundary of plating, as shown in FIG. 12. Charging in this way ensures maximal charging current is used, and by proxy, minimal charge time is pursued. The procedure to compute charge curves for the nominal model 400 is illustrated in FIGS. 13A-13B.

Figure 13A:
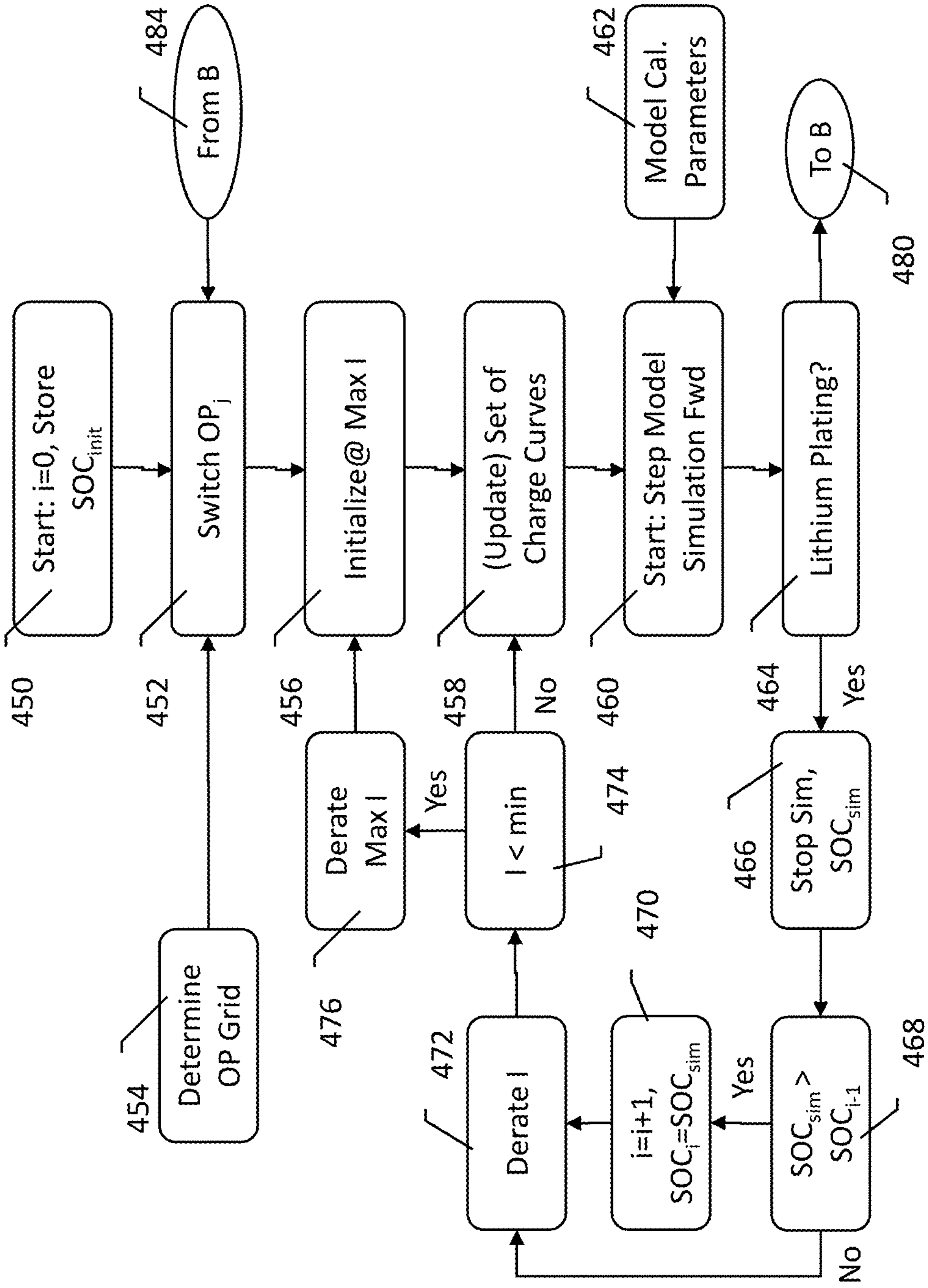
FIGS. 13A-13B show, in block form, a process flow.

In FIG. 13A, starting at 450, the off-line modeling stores an initial SOC ($SOC_{init}$). An operating point grid is set at 454 and used at 452 to select or switch operating parameters to $OP_i$. At the first iteration, block 452 would select $OP_0$, for example, and then iterates as the cycle repeats. Each grid point, $OP_i$, may include each of an $SOC_{init}$, SOC, pack temperature $T_p$, SOH, etc. The method initializes at a maximum current (Max I) at block 456, and then generates a set of charge curves at 458. The model simulation is then stepped forward at 460 to determine a next state, using in this example the model calibration parameters 462. The model calibration parameters at 462 are determined from, for example, laboratory tests, cell teardown, data driven methods, etc. (I); resulting in a set of physical, electrochemical, and/or geometric parameters. It is expected that the simulation model correctly predicts plating behavior under a range of operating conditions.

As indicated at 464, the model is used to determine whether lithium plating would arise in the simulated conditions. If lithium plating conditions would arise given the model and current, then the simulation stops and stores a current SOC, $SOC_{sim}$, as indicated at 466. If $SOC_{sim}$ is greater than the preceding $SOC_{i-1}$, the system iterates (i=i+1) at 470, the $SOC_{sim}$ is stored as the $i^{th}$ SOC, and the method proceeds to 472. If $SOC_{sim}$ is not greater than the preceding $SOC_{i-1}$, then no charge can be delivered at the current, I, and the method proceeds to 472 where the current, I, is derated still further. If I is less than a minimum value at 474 (after derating at 472), then the maximum current is derated at 476 and the method returns to 456; otherwise the charge curves are updated at 458 and the simulation continues to 460. If no lithium plating is sensed at 464, the method proceeds to B 480.

Figure 13B:
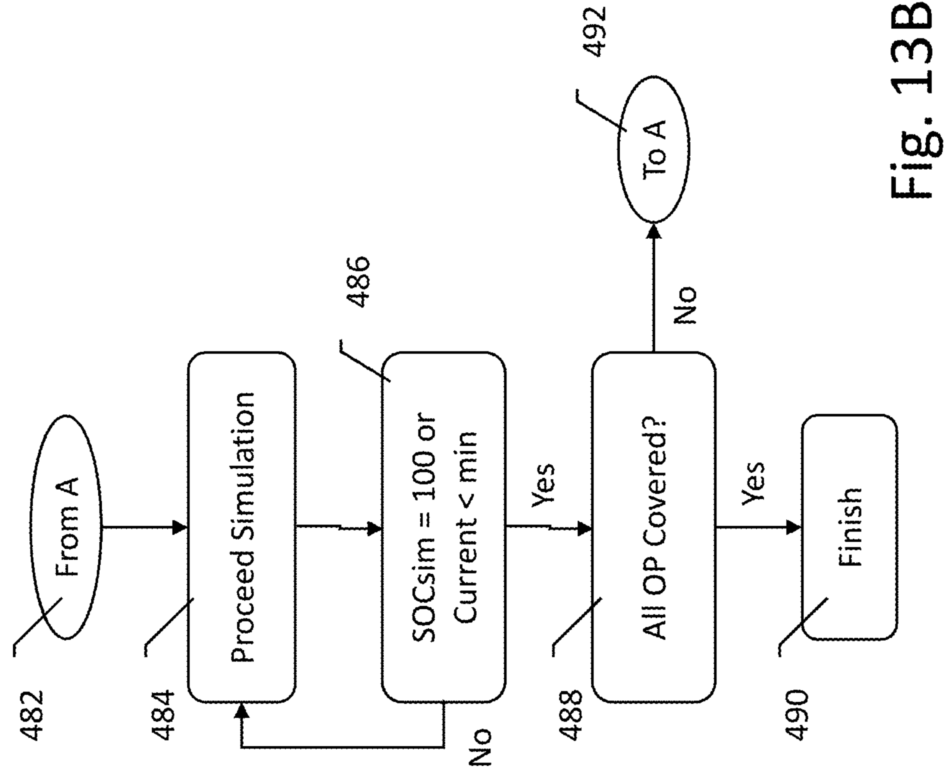

Turning to FIG. 13B, the method continues at 482 and proceeds with further simulation 484, as the SOC rises. If SOC reaches a maximum at 486 (shown as 100% but other upper limits can be used), or the current is derated below a minimum limit, then the method determines whether all operating points have been covered at 488. If not, the method returns to A, as indicated at 492 and returns to block 462 of FIG. 13A. Once the full grid of operation points have been covered, the method stops at 490.

Combined, the method of FIGS. 13A-13B acts as a search algorithm that iterates through the grid of operating points 454. At each step, a maximal permissible current is chosen and the charge curve in the nominal model for the given operating point is initialized at this level. The initialization level $SOC_{init}$, is taken from the set of operating points denoting battery SOC at the beginning of the charge procedure. The charge current in this initial step can be a constant value, or other pre-determined function such as a ramp, etc. This charging current is fed to the numerical model until the internal states of the model indicate that plating is occurring 464. Plating determination at 464 may be predicted based on overpotential against a Li/Li+ reference, plating current or possibly other electrochemical states and indicators simulated by the numerical model.

Should plating occur, the simulation is stopped and the SOC level at which plating was occurring is noted as $SOC_{sim}$. If SOC sim is larger than the previous plating SOC level, at 468, it will be noted as the limiting SOC at 470, and current will be decreased for the next step at 472 and the charge curve corresponding to the given operating point in the nominal model is finally updated at 458, restarting the simulation cycle. Ideally, each new cycle increases the plating boundary in terms of the actual $SOC_i$ and the charge proceeds until SOC=100% or other maximal limit. If, however, the $SOC_{sim}$ is the same as in the preceding step, No at 468, the current must be derated at 481 but without denoting the limited SOC. This simply means, that the derating step was too small and even less current is needed to avoid plating in order to move to the next SOC resolution point. This procedure will repeat until the condition at 468 is met, and then the search will resume.

Another possibility is, that after an initial high current section the solid electrolyte interface is so saturated with non-intercalated Li cations, that even turning off the charging current completely (as by reaching a minimal current limit at 474) will cause damage to the battery at 464. In this case, the maximal starting current must be derated 476 and the procedure restarted from block 456.

The algorithm searches for the charge curve until the simulation SOC reaches 100%, and when all operating points have been covered it is terminated.

Figure 14:
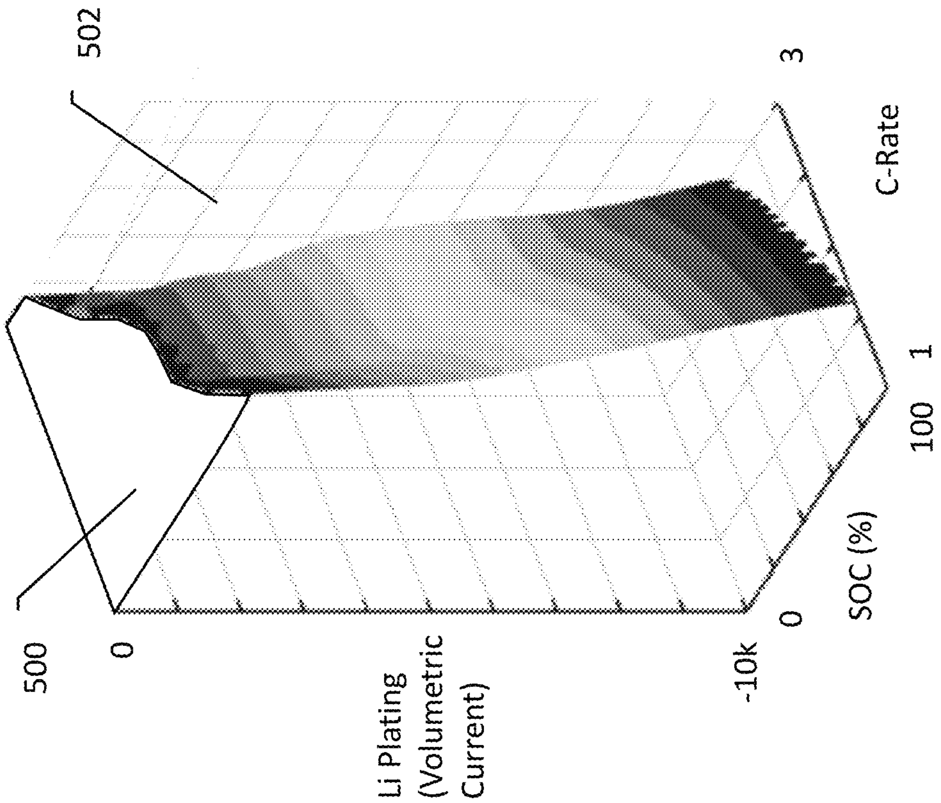
FIG. 14 graphically illustrates lithium plating response to charge current.

FIG. 14 illustrates a static lithium plating response to charge current, in relation to SOC. At each of a range of volumetric currents associated with lithium plating, a boundary is drawn using SOC and C-Rate, with unsafe plating to the right side of the surface defined by a series of curves as indicated at 502. Safe plating is in the operating region at 500.

Figure 15:
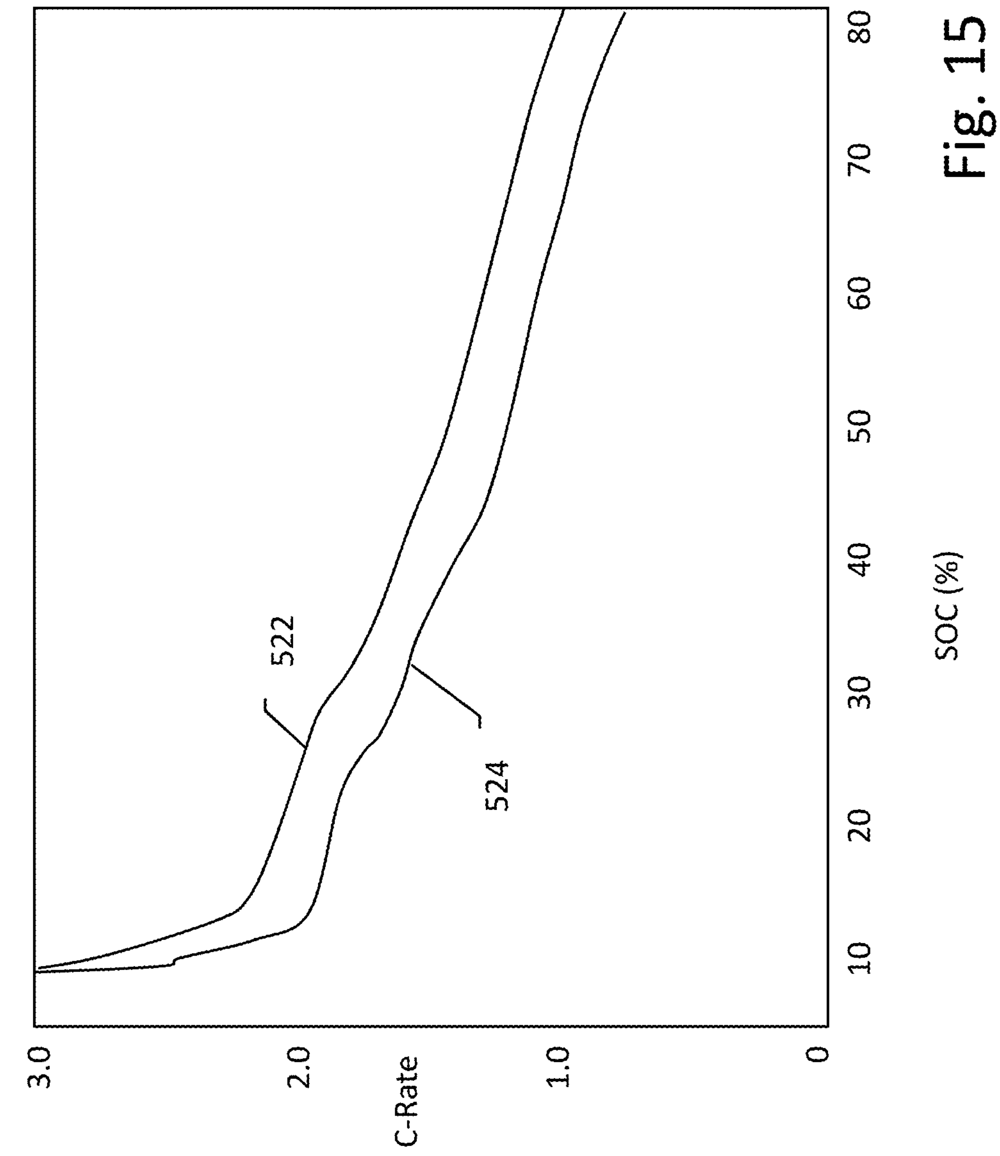
FIG. 15 illustrates a set of charge limiting curves based on battery dynamic state.

FIG. 15 illustrates a set of charge limiting curves, each for a different battery dynamic state. For a given SOC, an upper boundary for the charging current in terms of C-Rate is given; above each curve, for a given set of conditions (initial SOC, temperature, etc.), lithium plating is expected. A static condition is illustrated at 522. Here, battery charge events are separated by at least some minimum time duration. A linked charge event condition is illustrated at 524. Here, the battery is under dynamic load, meaning that its ability to handle high charging currents is also given by its previous electrochemical history during the past continuous charge event with variable C-rate.

As a result, when the dynamic (linked) charge condition is met for a given battery or vehicle, the upper limit of charge current (curve 524) will be reduced relative to the upper limit which would apply in a static condition (curve 522). Charging current itself would vary over time as a function of the hard limits illustrated by the charge limiting curves of FIG. 15 (which are set according to SOC) and any other factors applicable to a given charging event, such as thermal controls, availability of high current at a given charging station, safety limitations, etc.

The values illustrated on the axes are merely illustrative; actual charge rates used in a particular instance will depend on charging station limitations, safety settings, or other factors set by the user, manufacturer or dynamically by a system controller as needed.

The above procedure is described for dynamic (linked) charge events, and may be simplified and sped up for static charge events, where each charge is taken separately to obtain the curve. In this case the inaccuracies would be compensated by the online charge detection and correction modules of FIG. 11. In the dynamic (linked) charge events, the internal electrochemical state affects the lithium plating behavior. Charge activity in a dynamic (linked) charge event context may be treated as a single continuous event, with charging and discharging occurring in close enough proximity (in time) that each action affects the next action.

In some examples, dynamic (linked) charge event analysis may be used if the vehicle battery does not return to a relaxed or steady state between charging and discharging events for at least a minimum period of time. For example, a vehicle which is neither subject to a charging event nor driven for at least a period of, for example, two hours may be considered as in a dynamic (linked) charge event state. If the minimum period of rest or steady state is achieved, then a static charge analysis will be sufficient. The minimum period of time at rest may be, for example, in the range of about 30 minutes to about 6 hours, or more or less. Other values for the minimum period may be used and may be specific to particular battery models, chemistries, etc., and may also vary with battery age if desired.

Figure 16:
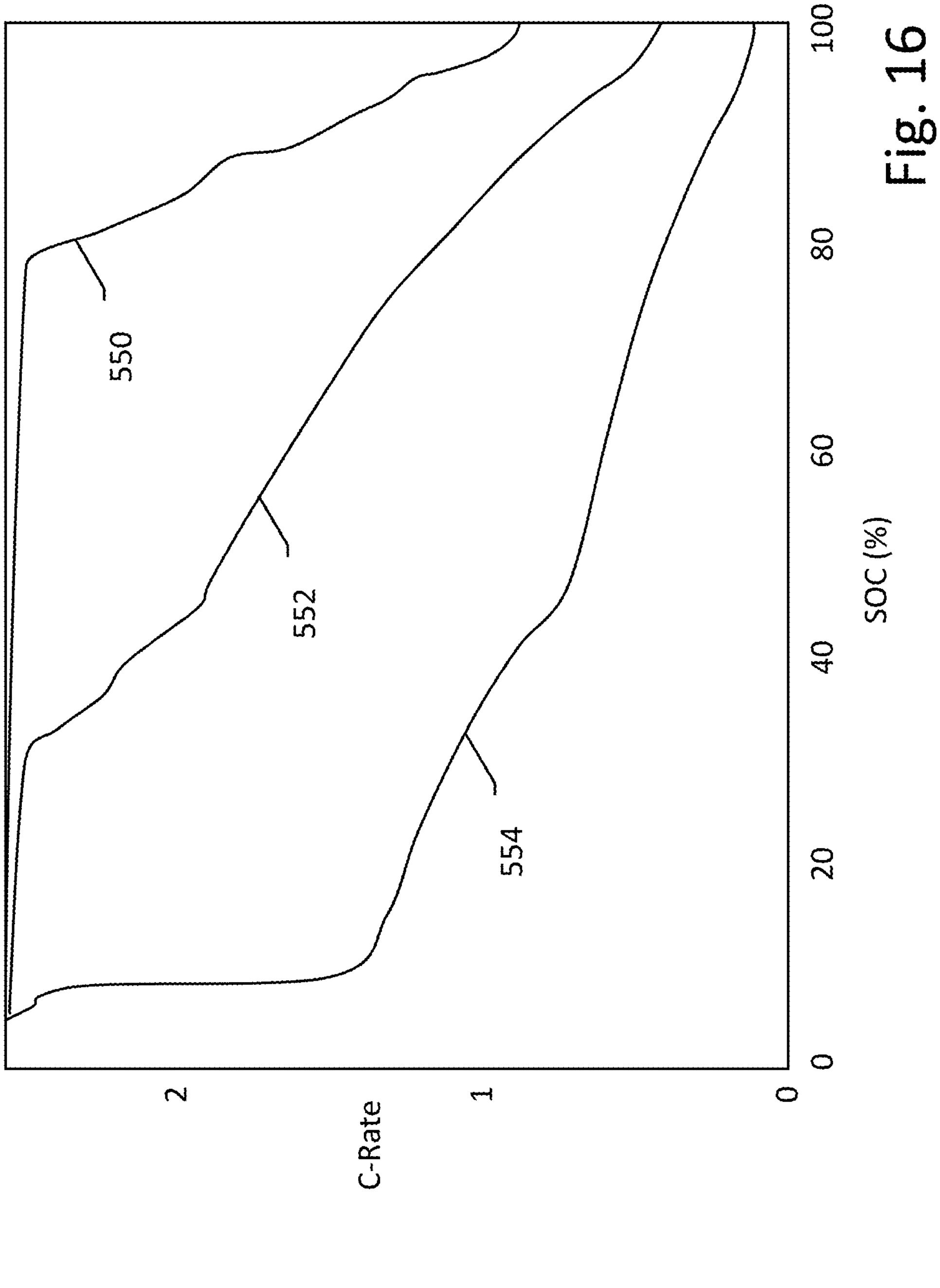
FIG. 16 illustrates a set of charge limiting curves based on battery temperature.

FIG. 16 illustrates a set of charging curves, each for a different battery temperature. At 550, an ideal battery temperature curve is illustrated, allowing charge current to remain relatively high until the battery SOC reaches a higher level, as opposed to curves 552 and 554, each of which may be for lower temperatures. It may be recalled that lithium plating is the dominant mechanism of battery degradation as temperature is lowered. As noted in FIG. 11, the battery state estimator may be used to obtain and track battery temperature during charging. If battery temperature is allowed to rise during the charging cycle, the system may use this information to adjust the limits from one curve toward the next (such as from 554 toward 552) during charging as the temperature changes, if desired. A battery thermal management system may be used to raise temperature during charging, or to allow heating (by, for example, limiting cooling pump activity) caused by charging to increase the battery temperature toward an optimized limit, for example.

Returning to FIG. 11, the method and model can be calibrated once, then evaluated off line to arrive at a set of charge curves such as shown in FIGS. 14-16 appropriate for the nominal model 400. An alternative variant may use cloud computing 402 used to periodically re calibrate the model and to store, analyze, predict and diagnose fleet or individual vehicle behavior based on charge curves.

The methodology to download and upload data from the cloud 402 may take any suitable form, such as using cellular communications or other configurations. For example, the method can be performed at a charging station having internet connectivity, and therefore WiFi, Bluetooth or other wireless short-range, or long range (cellular) communications can be used to communicate data back and forth between a given vehicle and the cloud 402, as desired.

Operational data is collected at the vehicle level such as, but not limited to SOC, SOH, current, voltage, temperatures etc., by, for example, the Battery Estimator 404 and/or online Li-plating detection block 410, and transferred to the cloud 402. If model parameters are recalibrated by the cloud 402, the method of FIGS. 13-A-13B may be launched or triggered, as desired. A data driven global optimization procedure such as genetic algorithm, particle search or other approach can thereby adjust the model parameters by evaluating the electrochemical model until a match between model response and operational data is reached by an objective numerical comparison. When this is achieved, the algorithm proceeds to find the charging curves for various operating points. When the procedure terminates and charging curves have been found for all operating points, the set of charging curves are transferred to the vehicle where the nominal model 400 resides.

The nominal model 400 utilizes the charge curves to compute the charging current for a given set of operating points. The current operating point is determined by data that is measured, filtered and post processed and estimated, for example, in the Battery Estimator 404 and may include SOC, temperature, SOH, etc.

There are several possible ways the set of charge curves can be used in the model 400 to compute charging currents in the vehicle, including but not limited to look up tables or explicit closed form functions fit to the charge curves. In the simplest case, the information from the battery estimator 404 is entered to lookup tables where the appropriate breakpoints and fractions are determined. This may yield several curves, each calibrated to different parameters (SOC and C-Rate relative to temperature; SOC and C-Rate relative to initial SOC; SOC and C-Rate relative to battery dynamic state, etc.). From the lookup tables, several curves may be fed to an interpolation algorithm, which uses the charge curves to set actual charging current. The charge curves themselves may be pre-computed offline and loaded to the vehicle microcontroller and/or memory and/or periodically updated based actual vehicle or fleet measurements from the cloud 402.

In another example, the charge curves are used as an input to a curve fitting procedure, whereby a closed form approximative mathematical function is obtained for a given vehicle and charge occurrence. Yet again, the closed form approximative mathematical function may be determined in the cloud 402 or by a local controller. For example, if sophisticated operations are needed, a separate computing device in the vehicle may be used, such as that disclosed in U.S. patent application Ser. No. 17/241,668, filed Apr. 27, 2021 and titled ADVANCED CONTROL FRAMEWORK FOR AUTOMOTIVE SYSTEMS, the disclosure of which is incorporated herein by reference. An approximated closed form solution can be also utilized to further optimize the charge curves by modeling the thermal response of the battery pack, and thus optimizing charge rates and/or thermal setpoints.

Thus, in an example, the battery state may be understood as having several components, and a separate charge curve defining a lithium plating border may be determined for each of a plurality of battery state components ($SOC_{init}$, Temperature, SOH, time since last charge event, etc.). This yields a set of charge curves. An interpolation, mathematical best fit, or other approximation follows to yield a single charge curve for the battery in its current state. Then, during charging, testing is performed to identify possible crossing of the lithium plating boundary contrary to the expectations built into the single charge curve, and an adjustment is made.

In some examples, after the single curve is determined, charging may take place with continuous adjustment toward the lithium plating boundary, until detection of lithium plating occurrence occurs, at which point the system steps back from the charge current causing the detection for a period of time, or number of steps, or change in SOC, as the case may be. Further, during charging, changes in any input, including in particular temperature which can vary, may trigger retrieval of a different operating point from the nominal model, which is used to then update the charging operation. The updates during charging are the focus of the next section.

No model can fully represent physical phenomena. The modelled plating boundaries may mismatch reality due to modelling errors, parametrization errors, manufacturing inconsistencies, unmodeled aging phenomena, etc. A hypothetical perfect model would create the fastest charge curve, thus no corrections or even detection mechanism would be needed, but that is hypothetical. In operation, the plating boundary may shift, leading to damage in the battery because of an overly aggressive strategy, or on the contrary, not use the full potential of the charging because of an overly cautious approach. Based on in operando lithium plating detection, the nominal charge curves can be corrected, and, using such correction, the nominal model is, in some examples, updated in operando by a limitation and correction logic 408, using the Li Plating Alert from detection block 410 to create a correction database.

Figure 17:
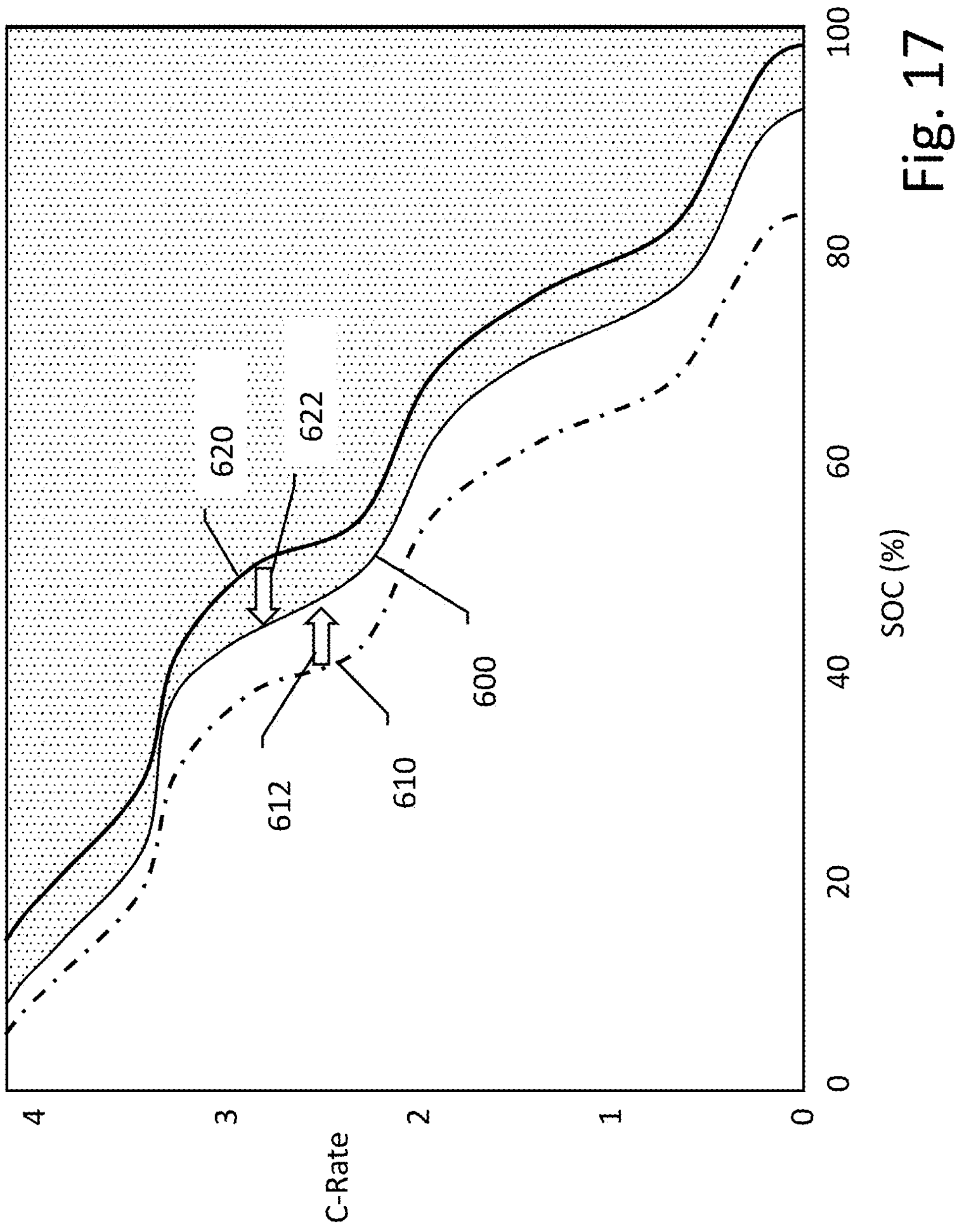
FIG. 17 illustrates charge limiting curve adjustments.

FIG. 17 illustrates the adjustments that are desired. Assuming, for example, that the true physical lithium plating limit is at line 600, if the model estimates a lithium plating boundary as shown at 610, the charging operation will be suboptimal and will take longer than necessary. Adjustment or correction in direction 612 would therefore be desired. On the other hand, if the model estimates a lithium plating boundary at shown at 620, this will be overly aggressive and lead to lithium plating. Adjustment or correction in direction 622 would then be desired.

Returning to FIG. 11, in an example, the correction block 408 processes information from the plating detection module 410, and creates and stores a correction database. First, the operating points measured or estimated when determining the nominal model 400 are used to determine a discrete grid of operating points, conforming to that of the nominal model. Doing so allows the correction block 408 to uniquely determine where the actual operating conditions lie in the correction database. Data from block 410 regarding lithium plating may be available any of continuously, periodically or by an event triggered logic. Rather than just a lithium plating alert as shown in FIG. 11, lithium plating data can be reported. The lithium plating data may be of binary nature indicating plating, or no plating (0 or 1), or may be reported in a range [0 to 1, or 0 to max, for example] expressing a physically relevant measure or a confidence level. For example, overpotential estimates or calculations may be reported directly.

The correction block 408 determines the necessary level of correction, for example, degrades current at the given operating point instantly, if plating is detected or, alternatively the current may be increased if no plating is positively confirmed for several repeated measurements. The downgrade and upgrade of charging current or power may in some examples be weighted, as by penalizing a plating event more severely than a non-plating event. The correction block 408 may express these limits in mathematically equivalent ways, such as but not limited to percentual change, absolute or relative change of current or power, etc.

The correction block 408 determines the operating point and decides on the correction to apply, and also stores the correction into the correction database. If desired, the correction database can be uploaded to the cloud 402 for use, for example, in fleet analysis based on climatic or geographic criteria, diagnostics, predictive maintenance or others. Such a cloud-based analysis may be utilized to create updated correction databases that may be further refined into groups based on, i.e. climatic, geographic, driver behavior, etc. This then may be downloaded from the cloud 402 to further improve the charging process.

In the vehicle, the correction database is then either directly used in a look up table procedure or may be approximated by closed form mathematical structures and applied by correction block 408 to adjust the nominal model data before determining the charging current to use. In the simplest case the correction database is directly imposed onto the nominal model using one or more of percentage of absolute adjustment to the current determined in the nominal model 400. Any such operation may occur within applicable absolute limits (safety, hardware design, etc.). The corrected current is passed into the battery but may be superimposed by excitation signal 412 as before controlled by the detection block 410.

The correction database may be enhanced by a forgetting logic if desired, to weight the relative importance of the corrections based on elapsed time, number of detection events or other events. The forgetting mechanism may collect further information that can be processed like the correction database itself in the cloud 402.

Figure 18:
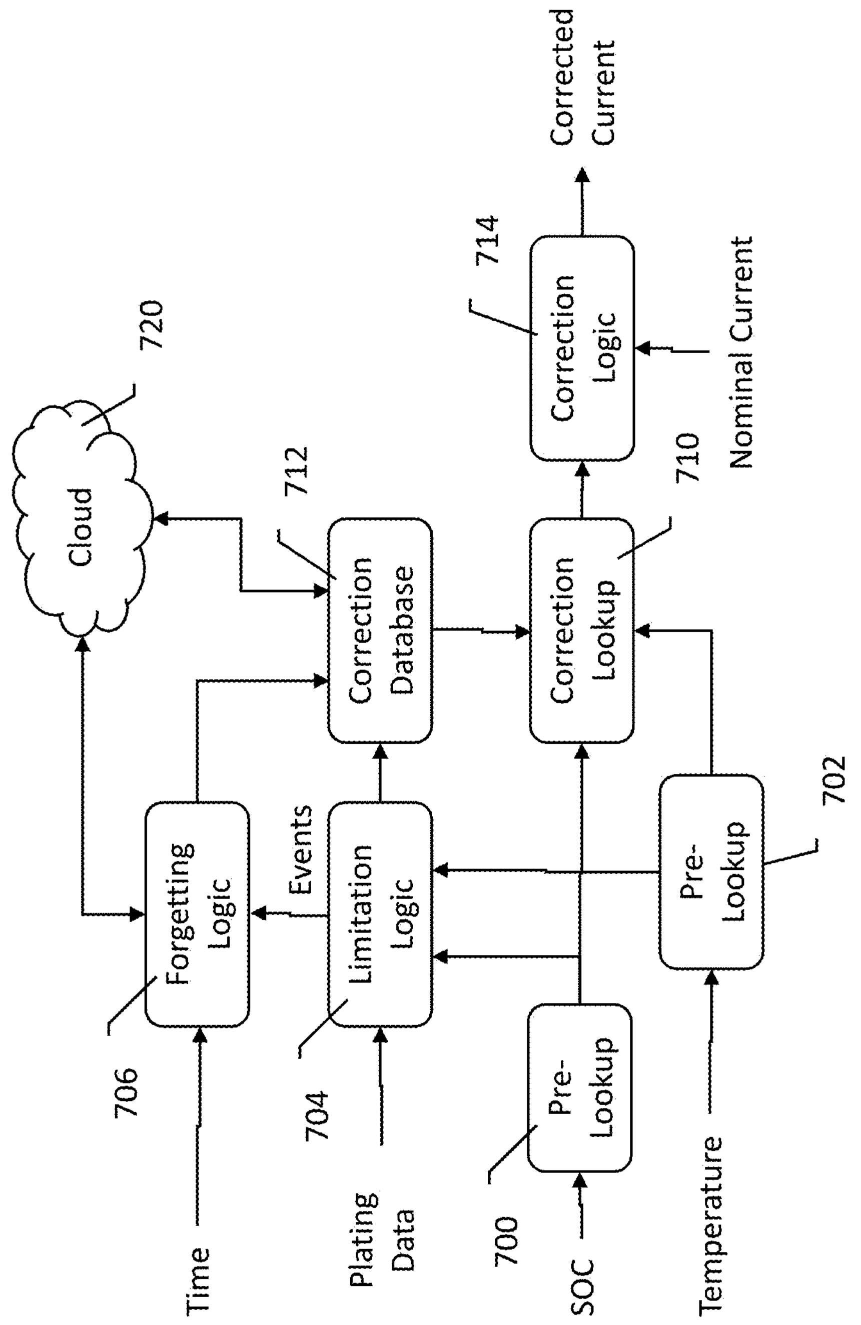
FIG. 18 illustrates in block form a charge limiting and correction logic.

An example of the current limitation and correction logic is given in FIG. 18. SOC and temperature data pass through pre-lookup tables 700 and 702, respectively, and provide inputs to a limitation logic 704, which also receives plating data. As noted above, plating data may include raw measurements or estimates (Li/Li+ for example, or plating detection as Boolean inputs, or a range of confidence, for example). The limitation logic 704 identifies any events of plating occurrence and provides input to the forgetting logic, which uses time as an input as well to determine whether and when any such events can be discounted as time passes. The limitation logic 704 also feeds data to the correction database. If a plating event is identified, the limitation logic 704 will identify the conditions of such plating for use in the correction database to either undo change that were previously made to the model to increase current, or to store a reduction in current relative to the model that is needed to prevent plating, for example; other steps may be used instead or in addition.

The pre-lookup tables 700 and/or 702 may also include selection criteria for determining whether dynamic (linked) or static upper limitations are to be applied, such as by determining whether at least a minimum time period of non-use (neither charging nor discharging) has elapsed. In addition, the pre-lookup tables 700 and/or 702 may include variants for different battery state-of-health (SOH) conditions, if desired. These and other modifications may be applied to tailor the pre-lookup tables 700, 702 to battery state.

A correction lookup 710 uses the SOC and temperature (and any other parameters that run though the pre-lookup stage) related data from the pre-lookups 700, 702 as well as data queried from the correction database 712 to determine any correction required in the correction logic to address inaccuracies in the nominal model. The correction logic 714 adjusts the nominal current that it receives and issues control signals to the charging circuitry to determine a corrected current. The corrected current can then be communicated from the vehicle to the charging station, which generates a requested current for charging the vehicle battery.

The outcome is a control algorithm that dynamically changes the issued charging current. The vehicle is charged based on the nominal model, if no plating is occurring. From the initial state, current is increased until the plating threshold is reached and/or plating occurs. If plating occurs, the limitation logic 704 is used to make an adjustment and store data in the forgetting logic 706 and correction database 712 related to the adjustment. The correction lookup 710 will determine that the correction logic should derate current in accordance with the data in the correction database. When no plating occurs, on the other hand, the correction database is continually updated to indicate the increasing current, until the plating limit is detected again. The point at which the limit is reached is then stored in the correction database 712. Any and all such data in the correction database 712 may be uploaded to the cloud 720 for fleet and other purposes noted previously, if desired.

The illustrative examples of FIGS. 11-18 can also be integrated into the method of FIG. 10. At an initialization time, i=0, the initial state of charge ($SOC_{init}$) is stored, as indicated at 300. Additional battery parameter components are obtained as well (temperature, SOH, etc.) at 300, and nominal charging curves are calculated in relation to each component. Interpolation is applied to determine an estimated charge curve using each of the component charging curves. Charging commences at a DC current setting, as indicated at 302, derived from the interpolated charging curves. If needed, preconditioning may take place before step 302.

As the DC charging continues, the SOC is tracked and the interpolated charging curve is used to determine DC charging steps. The above described adjustments, increasing the current beyond that of the charging curve, are performed. On continuous, periodic, or an event-triggered basis, an EIS signal is applied at 304, using either an excitation current or excitation voltage, which may be generated as described above. Measurement of the battery response to the EIS signal is next, at 306, using a voltage measurement if the EIS signal at 304 is a current, or a current measurement if the EIS signal at 304 is a voltage. Spectral analysis 308 is performed, using for example, a fast Fourier transformation or other frequency-based analysis as desired. The results of the spectral analysis from 308 go through a DRT analysis to then determine, using the comparison at 312, whether any Lithium plating phenomena have been detected. The method of FIG. 18 can then be used at the charging controller 320 to determine whether to derate current in response to detected Lithium plating, or, on the other hand, to adjust current above that of the interpolated curve.

The charging controller 320 uses the returned values of SOC and $R_{SEI,r}$ to determine whether to increase or decrease the DC setting current using the method of FIG. 18, which can be revised external to the iterating loop by the charging controller 320. The method then determines whether the SOC target has been reached for the battery at block 314; if not, the method iterates to 304 where another EIS signal is applied. Once the SOC target is reached, the method terminates and signals completion of the DC charging period to the charging controller 120, which can indicate that the target SOC (usually, but not limited to, 80%); if further charging is desired, constant voltage charging may commence, for example, or any other suitable steps can take place.

It should be understood that the charging controller may adjust charging current by communicating with the charging station, external to the vehicle. For example, during charging, the vehicle charging controller communicates to an external charging station (or, optionally, to an onboard charger) to request or command setting and/or changing of the charging current, such as by physical connection and/or wireless communication. This approach may be used in any example herein.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." Moreover, in the claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic or optical disks, magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, innovative subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the protection should be determined with reference to the appended claims, along with the full scope of equivalents to which such claims are entitled.

What is claimed is:

1. A method of charging a vehicle battery comprising: determining an estimated state of the vehicle battery; initiating charging of the vehicle battery at a charging current determined from a predetermined model for charging the vehicle battery, the predetermined model including a plurality of modeled secondary electrolyte-interphase layer (SEI) resistance values; measuring SEI resistance as the vehicle battery is charged; adjusting the charging current to enable the measured SEI resistance to track the modeled SEI resistance values.

2. The method of claim 1, wherein the predetermined model is derived by: defining a grid of temperatures; testing a test battery response to injected charge current for a plurality of the grid of temperatures in a series of test current injections corresponding to a plurality of charging current levels: measuring SEI resistance for the series of test current injections to calculate a series of SEI resistance values each associated with a temperature, an injected charge current and a battery state of-charge (SOC); normalizing the series of SEI resistance values and storing a look-up table; and constructing a polynomial model of SEI resistance as a function of SOC and temperature and current dependent parameters from the look-up table.

3. The method of claim 2, wherein the predetermined model is further derived from the polynomial model by taking a time derivative, and replacing the temperature and current dependent parameters from the look-up table with piece-wise linear model structures.

4. The method of claim 1, wherein the step of adjusting the charging current performed by:

setting a maximum lithium plating boundary;

estimating a first battery state of charge at a time instance;

using the first battery state of charge and the SEI resistance as inputs to the predetermined model, determining from the predetermined model that the maximum lithium plating boundary has been exceeded and, in response, reducing the charging current.

5. The method of claim 1, wherein the step of adjusting the charging current is performed by:

setting an acceptable lithium plating boundary;

estimating a first battery state of charge at a time instance;

using the first battery state of charge and the SEI resistance as inputs to the predetermined model, determining from the predetermined model that the acceptable lithium plating boundary has not been reached and, in response, increasing the charging current.

6. The method of claim 1, wherein the step of adjusting the charging current performed by:

setting an acceptable lithium plating boundary and a maximum lithium plating boundary;

estimating a first battery state of charge at a time instance;

using the first battery state of charge and the SEI resistance as inputs to the predetermined model, determining from the predetermined model one of the following:

the acceptable lithium plating boundary has not been reached and, in response, increasing the charging current; or the maximum lithium plating boundary has been exceeded and, in response, reducing the charging current; or otherwise maintaining the charging current until at least a next time instance.

7. The method of claim 1, wherein the step of measuring SEI resistance as the vehicle battery is charged is performed by:

applying an excitation current to one or more cells of the vehicle battery, the excitation current being applied at two or more frequencies;

measuring voltage of the one or more cells responsive to the excitation current at the two or more frequencies;

performing a spectral analysis on the measured voltage to determine excitation spectra;

and estimating SEI resistance of the one or more cells using the excitation spectra.

8. A method of charging a vehicle battery comprising:

determining an estimated state of the vehicle battery; obtaining a nominal charge curve from a model for the vehicle battery;

updating the nominal charge curve to set and adjust an actual charge curve by detecting lithium plating conditions during charging;

using the adjusted actual charge curve to control charging current delivered to the vehicle; and wherein the step of updating the nominal charge curve to set and adjust the actual charge curve by detecting lithium plating conditions during charging is performed by measuring secondary electrolyte-interphase layer (SEI) resistance as the vehicle battery is charged.

9. The method of claim 8, wherein the step of measuring SEI resistance as the vehicle battery is charged is performed by:

applying an excitation current to one or more cells of the vehicle battery, the excitation current being applied at two or more frequencies;

measuring voltage of the one or more cells responsive to the excitation current at the two or more frequencies;

performing a spectral analysis on the measured voltage to determine excitation spectra; and estimating SEI resistance of the one or more cells using the excitation spectra.

10. The method of claim 8, wherein the step of updating the nominal charge curve to set and adjust the actual charge curve is performed by:

comparing the estimated SEI resistance to a threshold to determine whether lithium plating is occurring, and:

if so, adjusting the actual charging curve down to reduce charging current;

if not, adjusting the actual charging curve up to increase charging current.

11. The method of claim 8, wherein the step of updating the nominal charge curve to set and adjust the actual charge curve is performed by storing a correction and limitation logic, responsive to detection of lithium plating during charging.

12. The method of claim 8, wherein the nominal charge curve is derived from a nominal model that contains a set of optimal charge curves computed off-line for a set of operating points of battery SOC defining nominal lithium plating boundaries.

13. The method of claim 12, wherein the nominal model relies on estimates of Li/Li+ overpotential in the battery, and the step of updating the nominal charge curve to set and adjust the actual charge curve by detecting lithium plating conditions during charging is performed by measuring secondary electrolyte-interphase layer (SEI) resistance as the vehicle battery is charged.

14. A vehicle comprising:

a motor generator unit (MGU) for providing motive power to the vehicle;

a rechargeable battery configured to provide electric power to the MGU;

a charging controller configured to control charging of the rechargeable battery by: determining an estimated state of the rechargeable battery;

initiating charging of the rechargeable battery at a charging current determined from a predetermined model for charging the rechargeable battery, the predetermined model including a plurality of modeled secondary electrolyte-interphase layer (SEI) resistance values; measuring SEI resistance as the rechargeable battery is charged;

adjusting the charging current to enable the measured SEI resistance to track the modeled SEI resistance values.

15. The vehicle of claim 14, wherein charging controller stores the predetermined model which has been derived by:

defining a grid of temperatures;

testing a test battery response to injected charge current for a plurality of the grid of temperatures in a series of test current injections corresponding to a plurality of charging current levels;

measuring SEI resistance for the series of test current injections to calculate a series of SEI resistance values each associated with a temperature, an injected charge current and a test battery state-of-charge (SOC);

normalizing the series of SEI resistance values and storing a look-up table; and constructing a polynomial model of SEI resistance as a function of SOC and temperature and current dependent parameters from the look-up table.

16. The vehicle of claim 14, wherein the charging controller is configured to adjust the charging current by:

setting a maximum lithium plating boundary;

estimating a first battery state of charge at a time instance;

using the first battery state of charge and the SEI resistance as inputs to the predetermined model, determining from the predetermined model that the maximum lithium plating boundary has been exceeded and, in response, reducing the charging current.

17. The vehicle of claim 14, wherein the charging controller is configured to adjust the charging current by:

setting an acceptable lithium plating boundary;

estimating a first battery state of charge at a time instance;

using the first battery state of charge and the SEI resistance as inputs to the predetermined model, determining from the predetermined model that the acceptable lithium plating boundary has not been reached and, in response thereto, increasing the charging current.

18. The vehicle of claim 14, wherein the charging controller is configured to adjust the charging current by:

setting an acceptable lithium plating boundary and a maximum lithium plating boundary;

estimating a first battery state of charge at a time instance;

using the first battery state of charge and the SEI resistance as inputs to the predetermined model, determining from the predetermined model one of the following:

the acceptable lithium plating boundary has not been reached and, in response to the acceptable lithium plating boundary not having been reached, increasing the charging current; or the maximum lithium plating boundary has been exceeded and, in response, reducing the charging current; or otherwise maintaining the charging current until at least a next time instance.

19. The vehicle of claim 14, wherein the charging controller is configured to measure SEI resistance as the vehicle battery is charged by:

applying an excitation current to one or more cells of the vehicle battery, the excitation current being applied at two or more frequencies;

measuring voltage of the one or more cells responsive to the excitation current at the two or more frequencies;

performing a spectral analysis on the measured voltage to determine excitation spectra; and estimating SEI resistance of the one or more cells using the excitation spectra.

* * * * *